US011411078B2

(12) United States Patent
Ryu et al.

(10) Patent No.: US 11,411,078 B2
(45) Date of Patent: Aug. 9, 2022

(54) SEMICONDUCTOR DEVICES INCLUDING DUMMY PATTERNS FOR DISCHARGING EFFECTS

(71) Applicant: SAMSUNG ELECTRONICS CO., LTD., Suwon-si (KR)

(72) Inventors: Hyojoon Ryu, Suwon-si (KR); Kiyoon Kang, Seoul (KR); Seogoo Kang, Seoul (KR); Shinhwan Kang, Suwon-si (KR); Jesuk Moon, Hwaseong-si (KR); Byunggon Park, Seoul (KR); Jaeryong Sim, Hwaseong-si (KR); Jinsoo Lim, Yongin-si (KR); Jisung Cheon, Ansan-si (KR); Jeehoon Han, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/701,427

(22) Filed: Dec. 3, 2019

(65) Prior Publication Data

US 2021/0013304 A1     Jan. 14, 2021

(30) Foreign Application Priority Data

Jul. 10, 2019   (KR) ........................ 10-2019-0083230

(51) Int. Cl.
*H01L 27/11565*   (2017.01)
*H01L 27/11582*   (2017.01)
(Continued)

(52) U.S. Cl.
CPC .......... *H01L 29/0649* (2013.01); *G11C 5/063* (2013.01); *H01L 23/3192* (2013.01);
(Continued)

(58) Field of Classification Search
CPC ........... H01L 27/11582; H01L 27/1157; H01L 27/11573; H01L 27/11575; H01L 27/11565

See application file for complete search history.

(56) References Cited

U.S. PATENT DOCUMENTS 8,178,917 B2   5/2012   Tanaka et al.
8,476,713 B2   7/2013   Lee et al.
(Continued)

*Primary Examiner* — Stephen M Bradley
*Assistant Examiner* — Gustavo G Ramallo
(74) *Attorney, Agent, or Firm* — Lee IP Law, P.C.

(57) ABSTRACT

A semiconductor device including a substrate having a cell, peripheral, and boundary area; a stack structure on the cell area and including insulating and interconnection layers that are alternately stacked; a molding layer on the peripheral area boundary areas; a selection line isolation pattern extending into the stack structure; a cell channel structure passing through the stack structure; and first dummy patterns extending into the molding layer on the peripheral area, wherein upper surfaces of the first dummy patterns, an upper surface of the selection line isolation pattern, and an upper surface of the cell channel structure are coplanar, and at least one of the first dummy patterns extends in parallel with the selection line isolation pattern or cell channel structure from upper surfaces of the first dummy patterns, the upper surface of the selection line isolation pattern, and the upper surface of the cell channel structure toward the substrate.

12 Claims, 21 Drawing Sheets

(51) Int. Cl.
  *H01L 29/06*   (2006.01)
  *H01L 23/31*   (2006.01)
  *G11C 5/06*    (2006.01)
  *H01L 27/1157* (2017.01)
  *H01L 27/11573* (2017.01)

(52) U.S. Cl.
  CPC .... *H01L 27/1157* (2013.01); *H01L 27/11565* (2013.01); *H01L 27/11573* (2013.01); *H01L 27/11582* (2013.01)

(56) References Cited

U.S. PATENT DOCUMENTS

| | | |
|---|---|---|
| 9,536,897 B2 | 1/2017 | Yoo et al. |
| 9,576,967 B1 | 2/2017 | Kimura et al. |
| 9,887,199 B2 | 2/2018 | Lim et al. |
| 9,893,082 B2 | 2/2018 | Kim et al. |
| 10,026,749 B2 | 7/2018 | Park et al. |
| 10,128,260 B2 | 11/2018 | Chung |
| 10,170,496 B2 | 1/2019 | Eom |
| 2015/0236038 A1 | 8/2015 | Pachamuthu et al. |
| 2016/0049423 A1* | 2/2016 | Yoo ............... H01L 27/11565 257/324 |
| 2016/0343434 A1* | 11/2016 | Lee ............... H01L 27/24 |
| 2016/0365357 A1* | 12/2016 | Kim ............... H01L 27/11565 |
| 2018/0151672 A1* | 5/2018 | Choi ............... H01L 27/1157 |
| 2018/0308559 A1* | 10/2018 | Kim ............... G11C 19/28 |
| 2018/0337140 A1 | 11/2018 | Luoh et al. |
| 2019/0067030 A1 | 2/2019 | Saitoh |
| 2019/0081054 A1 | 3/2019 | Kim et al. |
| 2019/0096901 A1* | 3/2019 | Dai ............... H01L 27/11519 |
| 2020/0027509 A1* | 1/2020 | Chen ............... H01L 27/11548 |

\* cited by examiner

FIG. 21
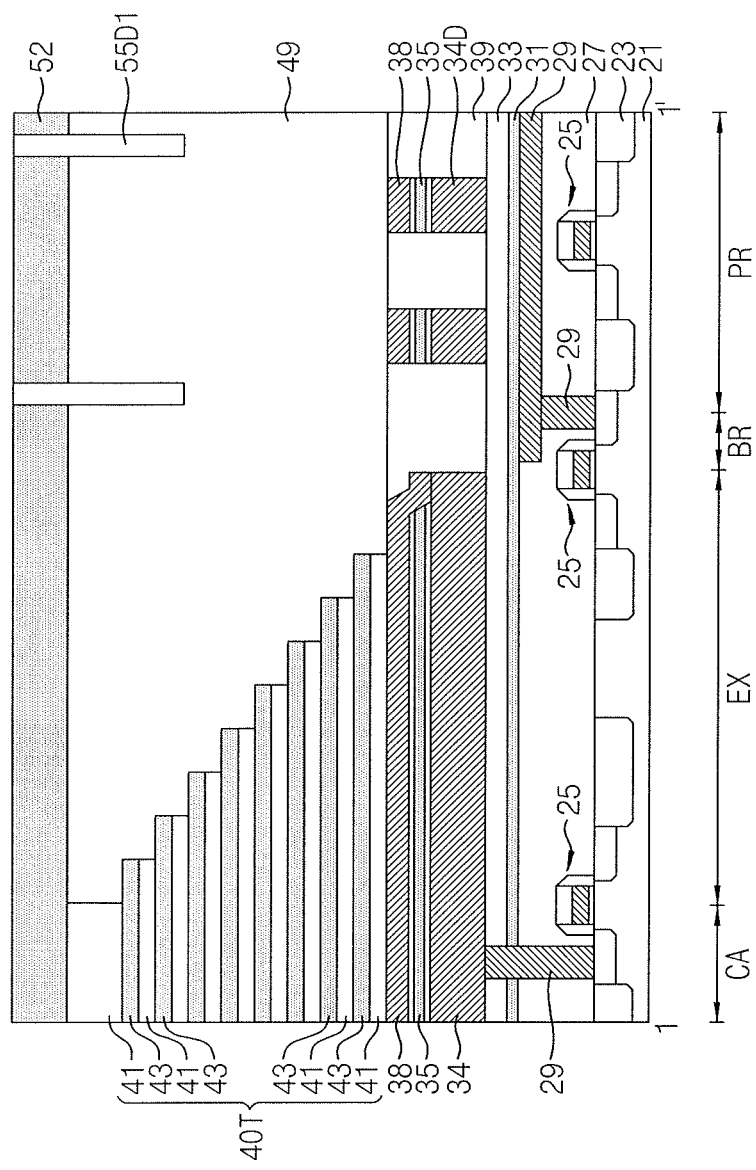
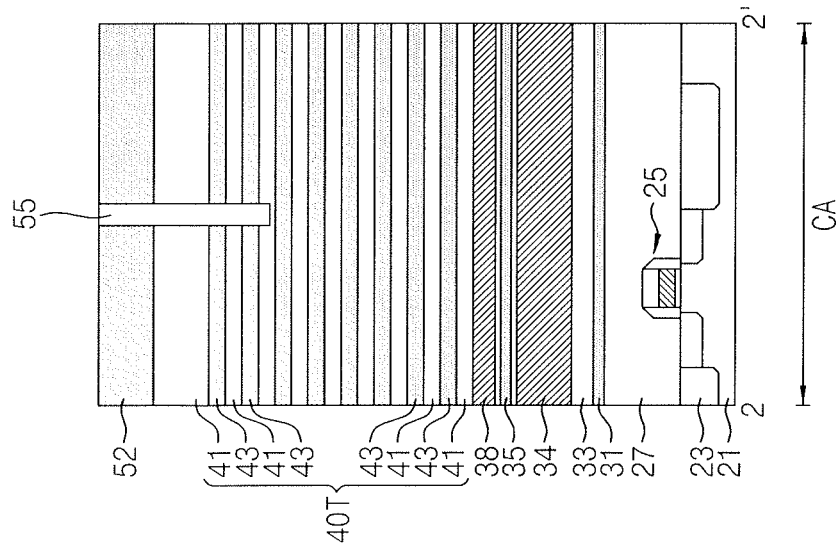

SEMICONDUCTOR DEVICES INCLUDING DUMMY PATTERNS FOR DISCHARGING EFFECTS

CROSS-REFERENCE TO RELATED APPLICATION

Korean Patent Application No. 10-2019-0083230, filed on Jul. 10, 2019, in the Korean Intellectual Property Office, and entitled: "Semiconductor Devices Including Dummy Patterns," is incorporated by reference herein in its entirety.

BACKGROUND

1. Field

Embodiments relate to semiconductor devices including dummy patterns.

2. Description of the Related Art

A method of forming a semiconductor device may include a plurality of thin-film forming processes, a plurality of patterning processes, and a plurality of annealing processes.

SUMMARY

The embodiments may be realized by providing a semiconductor device including a substrate having a cell area, a peripheral area, and a boundary area between the cell area and the peripheral area; a stack structure on the cell area of the substrate, the stack structure including a plurality of insulating layers and a plurality of interconnection layers that are alternately stacked; a molding layer on the peripheral area and the boundary area of the substrate; a selection line isolation pattern extending into the stack structure; a cell channel structure passing through the stack structure; and a plurality of first dummy patterns extending into the molding layer on the peripheral area, wherein upper surfaces of the plurality of first dummy patterns, an upper surface of the selection line isolation pattern, and an upper surface of the cell channel structure are substantially coplanar, and at least one of the plurality of first dummy patterns extends substantially in parallel with the selection line isolation pattern or the cell channel structure from the upper surfaces of the plurality of first dummy patterns, the upper surface of the selection line isolation pattern, and the upper surface of the cell channel structure toward the substrate.

The embodiments may be realized by providing a semiconductor device including a substrate having a cell area, a peripheral area, and a boundary area between the cell area and the peripheral area; a stack structure on the cell area of the substrate and including a plurality of insulating layers and a plurality of interconnection layers that are alternately stacked; a molding layer on the peripheral area and the boundary area of the substrate; a cell channel structure passing through the stack structure; and a first dummy channel structure extending into the molding layer on the peripheral area, wherein an upper surface of the first dummy channel structure and an upper surface of the cell channel structure are substantially coplanar, and the first dummy channel structure extends substantially in parallel with the cell channel structure from the upper surface of the first dummy channel structure and the upper surface of the cell channel structure toward the substrate.

The embodiments may be realized by providing a semiconductor device including a substrate having a cell area and a peripheral area; a stack structure on the cell area of the substrate and including a plurality of insulating layers and a plurality of interconnection layers that are alternately stacked; a molding layer on the peripheral area of the substrate; a selection line isolation pattern extending into the stack structure; a cell channel structure passing through the stack structure; and a dummy isolation pattern extending into the molding layer, wherein an upper surface of the dummy isolation pattern and an upper surface of the selection line isolation pattern are substantially coplanar, and the dummy isolation pattern extends substantially in parallel with the selection line isolation pattern from the upper surface of the dummy isolation pattern and the upper surface of the selection line isolation pattern toward the substrate.

BRIEF DESCRIPTION OF THE DRAWINGS

Features will be apparent to those of skill in the art by describing in detail exemplary embodiments with reference to the attached drawings in which:

FIGS. 17 to 24 illustrate cross-sectional views of stages in a method of forming semiconductor devices according to an embodiment.

DETAILED DESCRIPTION

Figure 1:
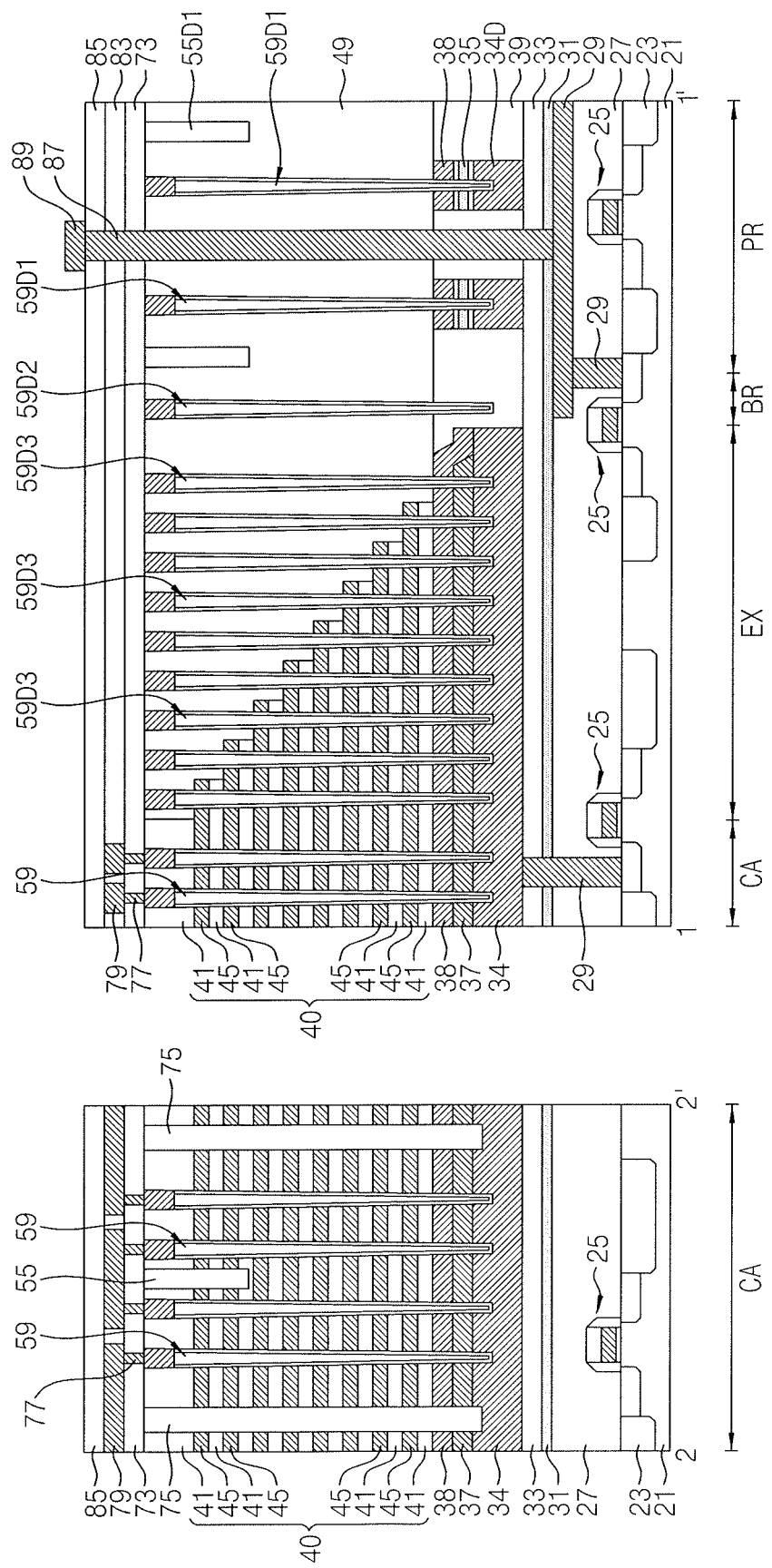
FIG. 1 illustrates cross-sectional views of semiconductor devices according to an embodiment.
Figure 2:
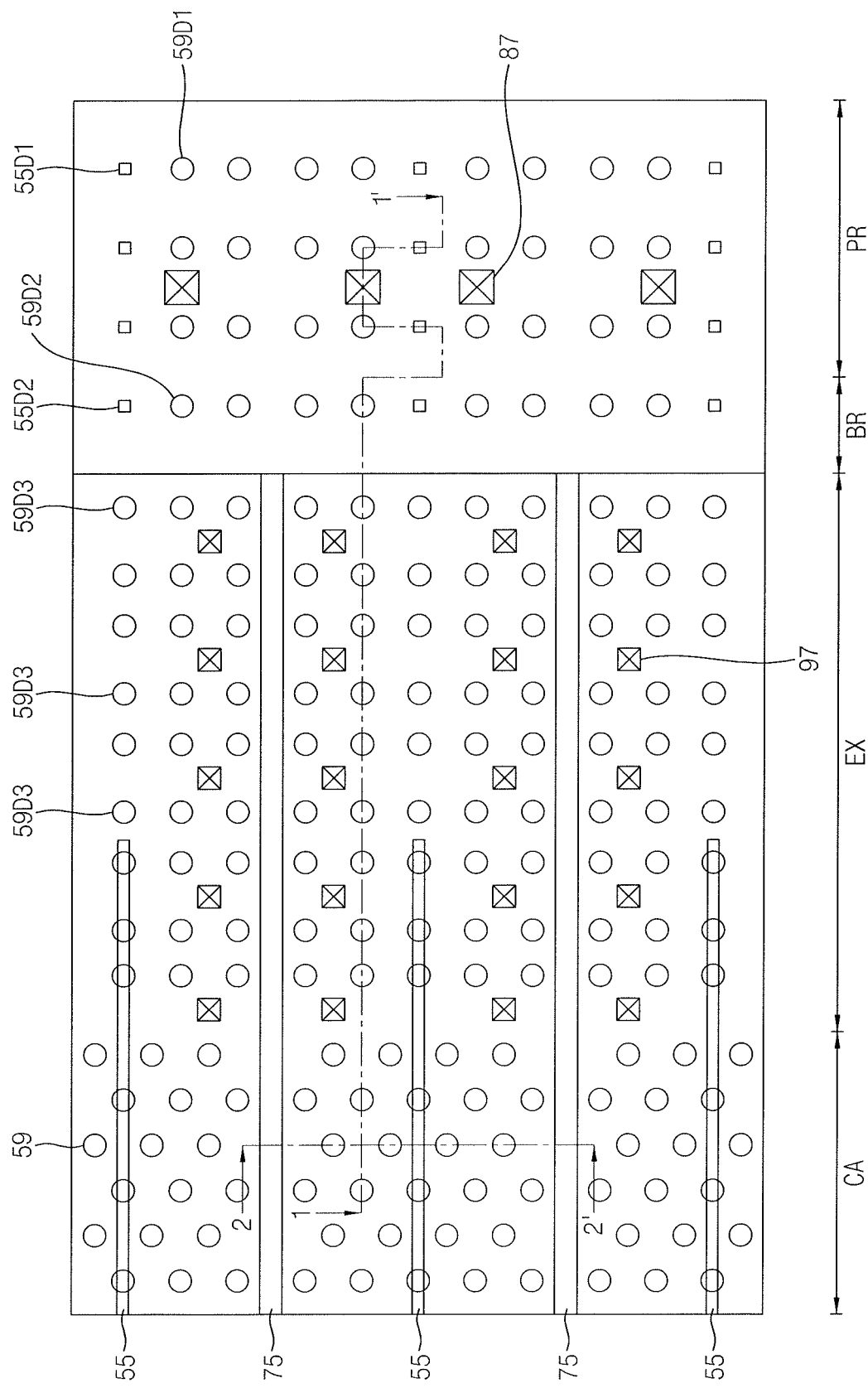
FIG. 2 illustrates a layout view of semiconductor devices according to an embodiment.
Figure 3:
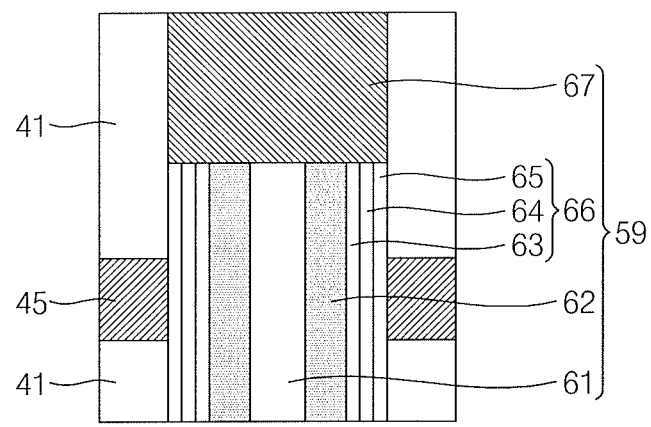
FIGS. 3 to 5 illustrate enlarged views of a portion of FIG. 1.
Figure 4:
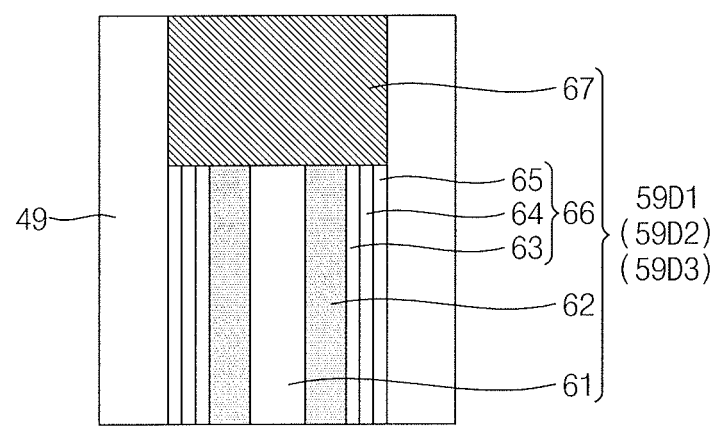
Figure 5:
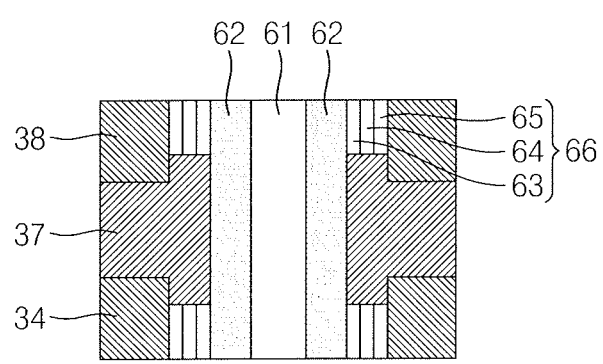

FIG. 1 illustrates cross-sectional views of semiconductor devices according to an embodiment. FIG. 2 illustrates a layout view of the semiconductor devices. FIG. 1 is a cross-sectional view taken along lines 1-1' and 2-2' of FIG. 2. FIGS. 3 to 5 illustrate enlarged views of a portion of FIG. 1. A semiconductor device according to an embodiment may include a non-volatile memory such as a V-NAND memory or a three-dimensional (3D) flash memory. The semiconductor device according to the embodiment may be interpreted as including a cell-on-peripheral (COP) structure.

Referring to FIG. 1, a semiconductor device according to an embodiment may include, e.g., a substrate 21, a first lower insulating layer 23, a plurality of transistors 25, a second lower insulating layer 27, a plurality of peripheral circuit interconnections 29, a third lower insulating layer 31, a fourth lower insulating layer 33, a first buried conductive pattern 34, a plurality of dummy conductive patterns 34D, a source mold layer 35, a second buried conductive pattern 37, a support 38, a lower molding layer 39, a stack structure 40, a molding layer 49, a selection line isolation pattern 55, a plurality of first dummy isolation patterns 55D1, a plurality of cell channel structures 59, a plurality of first dummy channel structures 59D1, a second dummy channel structure 59D2, a plurality of third dummy channel structures 59D3, a first upper insulating layer 73, a plurality of word line isolation patterns 75, a plurality of bit plugs 77, a plurality of bit lines 79, a second upper insulating layer 83, a third upper insulating layer 85, a through electrode 87, and an upper interconnection 89. The substrate 21 may include a cell area CA, a connection area EX, a boundary area BR, and a peripheral area PR. The stack structure 40 may include a plurality of insulating layers 41 and a plurality of interconnection layers 45 that are alternately and repeatedly stacked.

Referring to FIG. 2, a semiconductor device according to an embodiment may include a plurality of selection line isolation patterns 55, a plurality of first dummy isolation patterns 55D1, a plurality of second dummy isolation patterns 55D2, a plurality of cell channel structures 59, a plurality of first dummy channel structures 59D1, a plurality of second dummy channel structures 59D2, a plurality of third dummy channel structures 59D3, a plurality of word line isolation patterns 75, a through electrode 87, and a plurality of word plugs 97.

Referring to FIG. 3, in an implementation, each of the plurality of cell channel structures 59 may include a core pattern 61, a channel layer 62 surrounding the outside of the core pattern 61, a data storage pattern 66 surrounding the outside of the channel layer 62, and a bit pad 67. The data storage pattern 66 may include a tunnel insulating layer 63 surrounding the outside of the channel layer 62, a charge storage layer 64 surrounding the outside of the tunnel insulating layer 63, and a blocking layer 65 surrounding the outside of the charge storage layer 64.

The core pattern 61 may include silicon oxide, silicon nitride, silicon oxynitride, a low-k dielectric, a high-k dielectric, polysilicon, or a combination thereof. The channel layer 62 may include a semiconductor layer such as polysilicon, amorphous silicon, single crystalline silicon, or a combination thereof. The tunnel insulating layer 63 may include an insulating layer such as silicon oxide. The charge storage layer 64 may include an insulating layer such as silicon nitride. The blocking layer 65 may include an insulating layer such as silicon oxide, silicon nitride, silicon oxynitride, a high-k dielectric, or a combination thereof. The bit pad 67 may include a conductive layer such as a metal, a metal nitride, a metal oxide, a metal silicide, a conductive carbon, polysilicon, or a combination thereof.

Referring to FIG. 4, in an implementation, each of the plurality of first dummy channel structures 59D1, the plurality of second dummy channel structures 59D2, and the plurality of third dummy channel structures 59D3 may include the same material as the plurality of cell channel structures 59. For example, each of the plurality of first dummy channel structures 59D1, the plurality of second dummy channel structures 59D2, and the plurality of third dummy channel structures 59D3 may include the core pattern 61, the channel layer 62, the data storage pattern 66, and the bit pad 67. The data storage pattern 66 may include the tunnel insulating layer 63, the charge storage layer 64, and the blocking layer 65.

Referring to FIG. 5, in an implementation, the second buried conductive pattern 37 may pass through the data storage pattern 66 and be in direct contact with a side surface of the channel layer 62.

Referring again to FIGS. 1 to 5, the connection area EX may be in continuity with the cell area CA (e.g., may be directly adjacent to the cell area CA and extend continuously therefrom). The boundary area BR may be between the cell area CA and the peripheral area PR. In an implementation, the boundary area BR may be between the connection area EX and the peripheral area PR.

The stack structure 40 may be on the cell area CA of the substrate 21. The stack structure 40 may extend onto the connection area EX. The molding layer 49 may be on the peripheral area PR and the boundary area BR of the substrate 21. The molding layer 49 may extend on the stack structure 40 on the connection area EX.

The plurality of word line isolation patterns 75 may be parallel to each other. Each of the plurality of word line isolation patterns 75 may intersect the stack structure 40 (e.g., may extend in a first direction). Each of the plurality of word line isolation patterns 75 may extend into the stack structure 40 in a second direction that intersects the first direction. In an implementation, each of the plurality of word line isolation patterns 75 may pass through the stack structure 40, the support 38, and the second buried conductive pattern 37 and extend into the first buried conductive pattern 34. The second direction may intersect an upper surface of the substrate 21 (e.g., the second direction may be a vertical direction in FIG. 1). In an implementation, the second direction may be perpendicular to the upper surface of the substrate 21. The first direction may be perpendicular to the second direction. The first direction may be parallel to the upper surface of the substrate 21 (e.g., the first direction may be a horizontal direction in FIG. 1).

The plurality of word line isolation patterns 75 may correspond to word line cuts. Some of the plurality of interconnection layers 45 may correspond to word lines. At least one of the plurality of interconnection layers 45, which is adjacent to a lower surface of the stack structure 40 (e.g., the surface proximate to the substrate 21 in the second direction), may correspond to a ground selection line (GSL). The second buried conductive pattern 37 may correspond to a source line or a common source line (CSL).

Each of the plurality of selection line isolation patterns 55 may be between the plurality of word line isolation patterns 75. Each of the plurality of selection line isolation patterns 55 may intersect the stack structure 40 on the cell area CA (e.g., may extend in the first direction). Each of the plurality of selection line isolation patterns 55 may extend onto the connection area EX in the first direction. Each of the plurality of selection line isolation patterns 55 may extend into the stack structure 40 in the second direction. In an implementation, at least one of the plurality of interconnection layers 45, which is adjacent to an upper surface of the stack structure 40 (e.g., the surface distal to the substrate 21 in the second direction), may correspond to a string selection line (SSL). Each of the plurality of selection line isolation patterns 55 may pass through some of the plurality of interconnection layers 45 which are adjacent to the upper surface of the stack structure 40.

Each of the plurality of first dummy isolation patterns 55D1 may extend into the molding layer 49 onto the peripheral area PR in the second direction. Each of the plurality of first dummy isolation patterns 55D1 may partially pass through the molding layer 49. The plurality of first dummy isolation patterns 55D1 may include the same material as the plurality of selection line isolation patterns 55. The plurality of selection line isolation patterns 55 and the plurality of first dummy isolation patterns 55D1 may include silicon oxide, silicon nitride, silicon oxynitride, a low-k dielectric, a high-k dielectric, or a combination thereof. Upper surfaces of the plurality of selection line isolation patterns 55 and the plurality of first dummy isolation patterns 55D1 may be substantially coplanar.

As noted above, the second direction may correspond to a direction toward the substrate 21 from the upper surfaces of the plurality of selection line isolation patterns 55 and the plurality of first dummy isolation patterns 55D1, e.g., a vertical direction in FIG. 1. Each of the plurality of first dummy isolation patterns 55D1 may be substantially parallel to each of the plurality of selection line isolation patterns 55, e.g., each may extend in the second direction. Lower ends (e.g., ends that face or are proximate to the substrate 21) of the plurality of first dummy isolation patterns 55D1 may be at similar levels (e.g., at similar distances from the substrate 21 in the second direction) relative to lower ends of the plurality of selection line isolation patterns 55.

Each of the plurality of second dummy isolation patterns 55D2 may be on the boundary area BR. The plurality of second dummy isolation patterns 55D2 may have configurations similar to those of the plurality of first dummy isolation patterns 55D1 and those of the plurality of selection line isolation patterns 55.

Each of the plurality of cell channel structures 59 may extend in the second direction into the stack structure 40 on the cell area CA. Each of the plurality of cell channel structures 59 may pass through the stack structure 40, the support 38, and the second buried conductive pattern 37 and extend into the first buried conductive pattern 34. The bit plugs 77 may be on the plurality of cell channel structures 59. The plurality of bit lines 79 may be on the plurality of bit plugs 77.

Each of the plurality of first dummy channel structures 59D1 may extend in the second direction into the molding layer 49 on the peripheral area PR. Some of the plurality of first dummy channel structures 59D1 may pass through the molding layer 49, the support 38, and the source mold layer 35 and extend into the plurality of dummy conductive patterns 34D. Each of the plurality of second dummy channel structures 59D2 may extend in the second direction into the molding layer 49 on the boundary area BR. Each of the plurality of second dummy channel structures 59D2 may pass through the molding layer 49 and extend into the lower molding layer 39. Each of the plurality of third dummy channel structures 59D3 may extend in the second direction into the molding layer 49 and the stack structure 40 on the connection area EX. Some of the plurality of third dummy channel structures 59D3 may pass through the molding layer 49, the stack structure 40, the support 38, and the second buried conductive pattern 37 and extend into the first buried conductive pattern 34.

The plurality of first dummy channel structures 59D1, the plurality of second dummy channel structures 59D2, and the plurality of third dummy channel structures 59D3 may include the same material as the plurality of cell channel structures 59. Upper surfaces (e.g., surfaces facing away from or distal to the substrate 21) of the plurality of first dummy channel structures 59D1, the plurality of second dummy channel structures 59D2, the plurality of third dummy channel structures 59D3, and the plurality of cell channel structures 59 may be substantially coplanar. Each of the plurality of first dummy channel structures 59D1, the plurality of second dummy channel structures 59D2, and the plurality of third dummy channel structures 59D3 may extend in the second direction and may be substantially parallel to each of the plurality of cell channel structures 59. Lower ends of the plurality of first dummy channel structures 59D1, lower ends of the plurality of second dummy channel structures 59D2, and lower ends of the plurality of third dummy channel structures 59D3 may be at similar levels to lower ends of the plurality of cell channel structures 59.

In an implementation, upper surfaces of the plurality of selection line isolation patterns 55, the plurality of first dummy isolation patterns 55D1, the plurality of second dummy isolation patterns 55D2, the plurality of first dummy channel structures 59D1, the plurality of second dummy channel structures 59D2, the plurality of third dummy channel structures 59D3, and the plurality of cell channel structures 59 may be substantially coplanar. The plurality of first dummy isolation patterns 55D1 and/or the plurality of first dummy channel structures 59D1 may be referred to as a plurality of first dummy patterns. The plurality of second dummy isolation patterns 55D2 and/or the plurality of second dummy channel structures 59D2 may be referred to as a plurality of second dummy patterns.

Each of the plurality of through electrodes 87 may extend in the second direction into the molding layer 49 on the peripheral area PR. Each of the plurality of through electrodes 87 may pass through the third upper insulating layer 85, the second upper insulating layer 83, the first upper insulating layer 73, the molding layer 49, the lower molding layer 39, the fourth lower insulating layer 33, and the third lower insulating layer 31 and be in contact with a selected one of a plurality of peripheral circuit interconnections 29. Each of the plurality of through electrodes 87 may be between a selected one of the plurality of first dummy channel structures 59D1 and the cell area CA. In an implementation, each of the plurality of through electrodes 87 may be between a selected one of the plurality of first dummy channel structures 59D1 and the boundary area BR.

Figure 6:
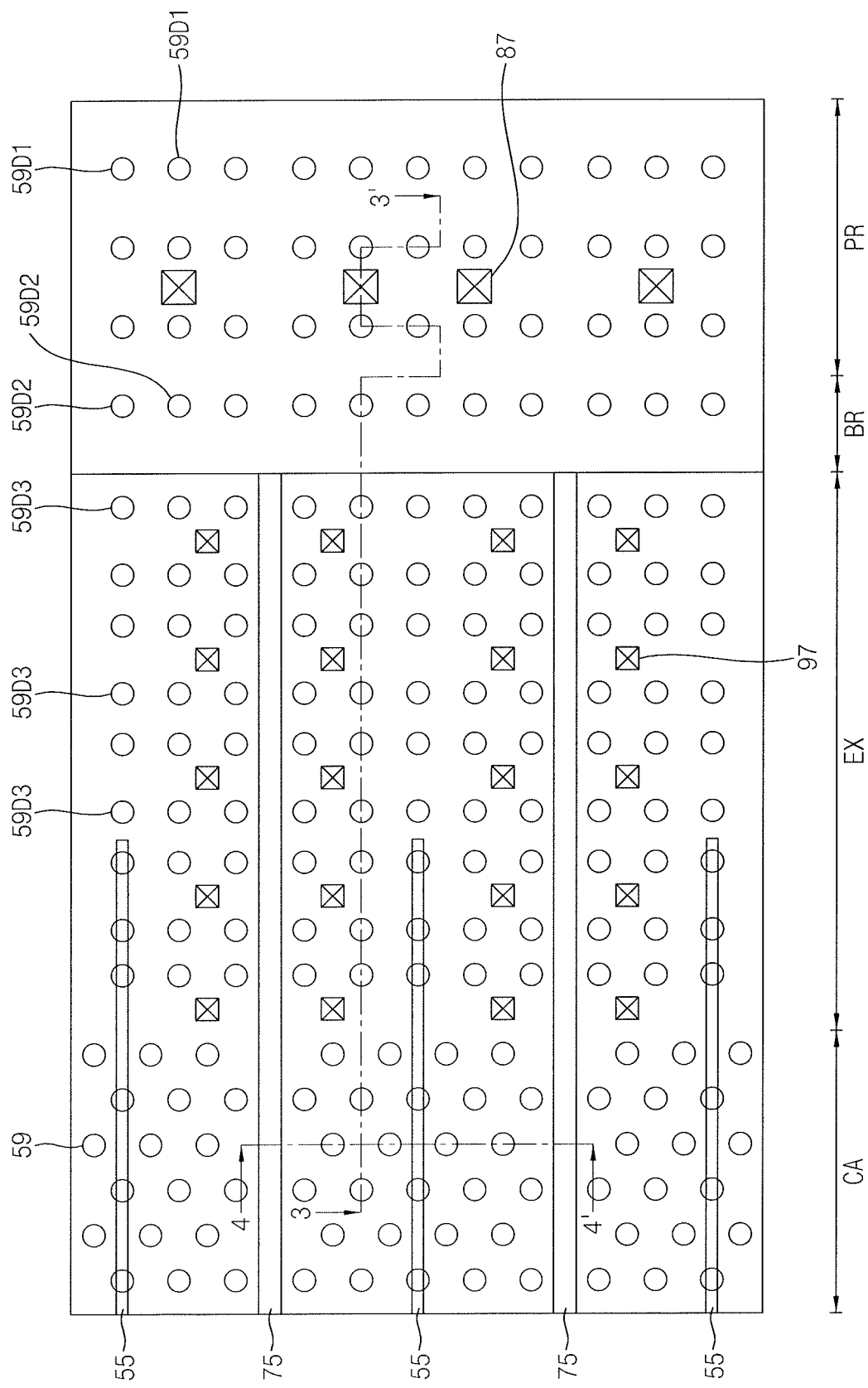
FIG. 6 illustrates a layout view of semiconductor devices according to an embodiment.
Figure 7:
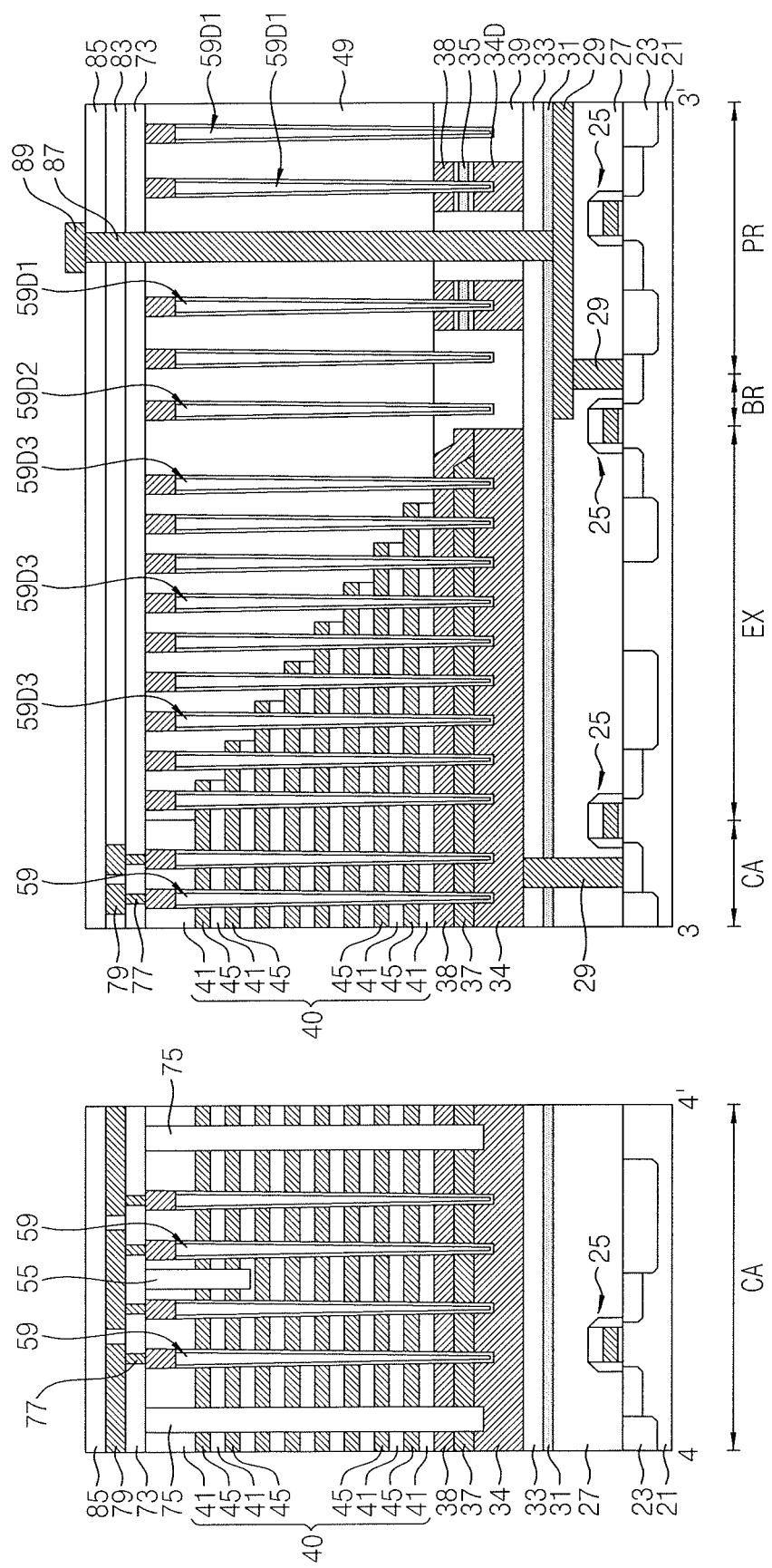
FIGS. 7 to 9 illustrate cross-sectional views of semiconductor devices according to an embodiment.
Figure 8:
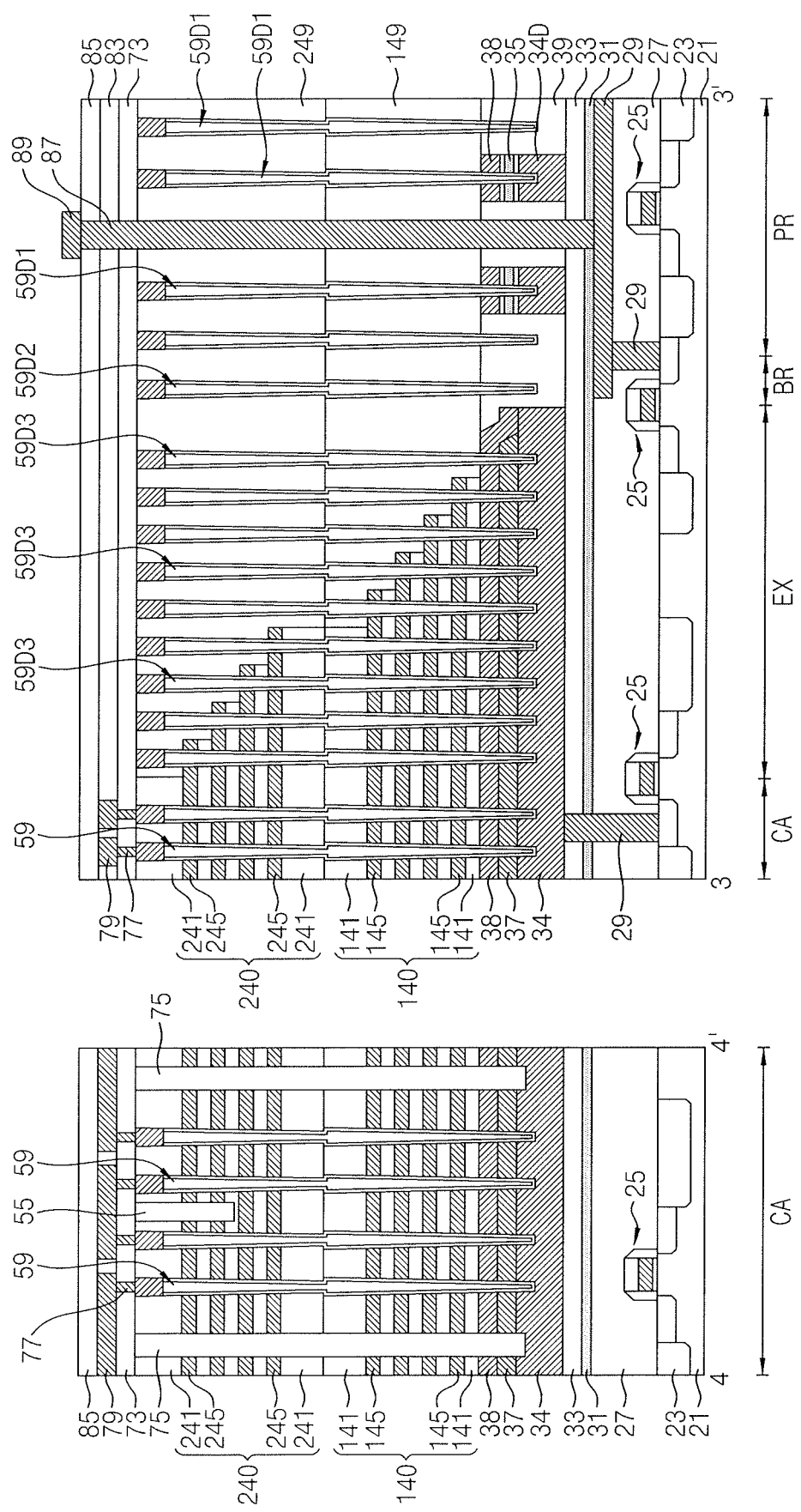
Figure 9:
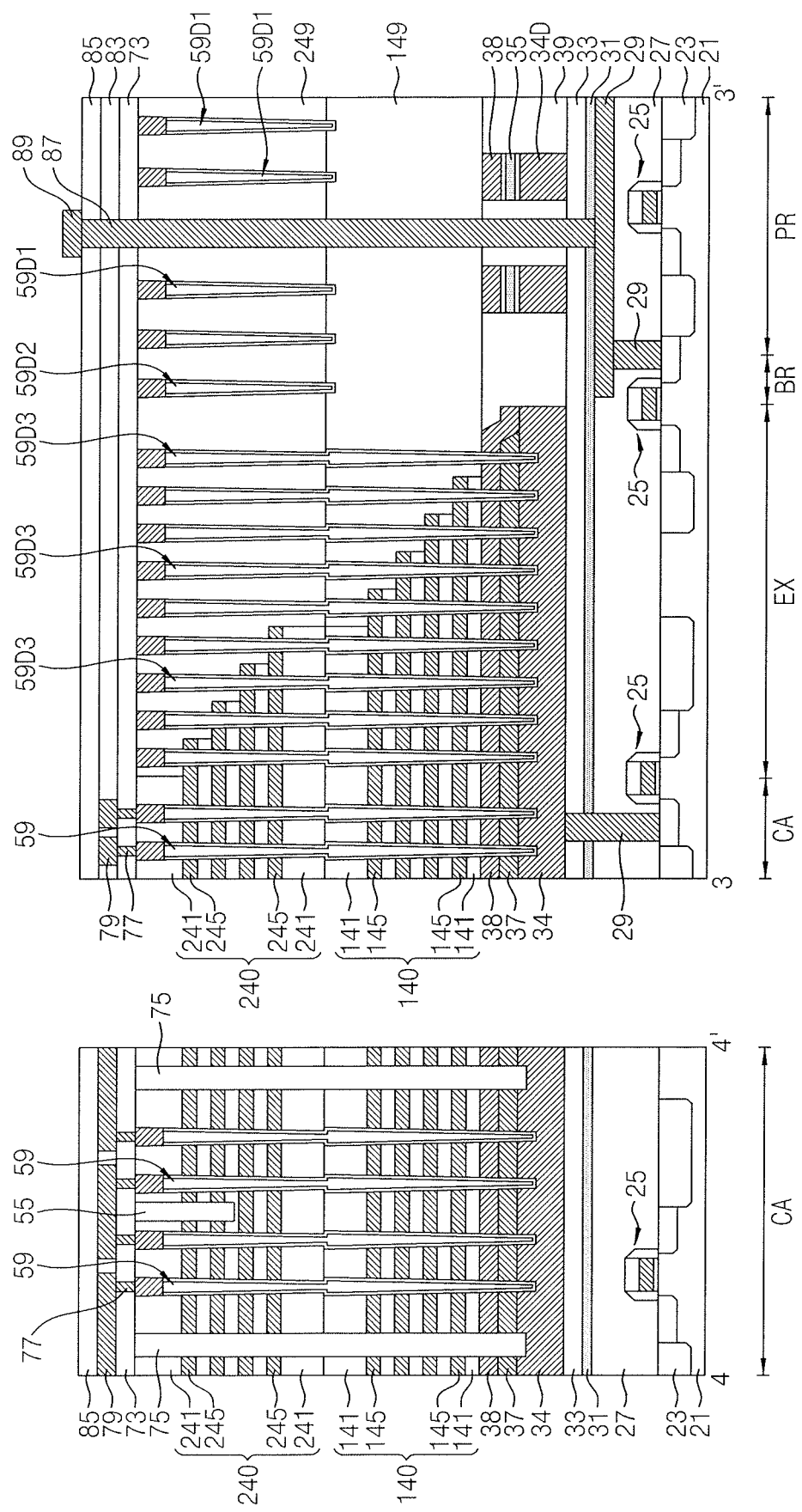

FIG. 6 illustrates a layout view of semiconductor devices according to an embodiment. FIGS. 7 to 9 illustrate cross-sectional views taken along lines 3-3' and 4-4' of FIG. 6 for describing the semiconductor devices of FIG. 6.

Referring to FIG. 6, a semiconductor device according to an embodiment may include a plurality of selection line isolation patterns 55, a plurality of cell channel structures 59, a plurality of first dummy channel structures 59D1, a plurality of second dummy channel structures 59D2, a plurality of third dummy channel structures 59D3, a plurality of word line isolation patterns 75, a plurality of through electrodes 87, and a plurality of word plugs 97. The plurality of cell channel structures 59 may be on a cell area CA. The plurality of first dummy channel structures 59D1 and the plurality of through electrodes 87 may be on a peripheral area PR. The plurality of second dummy channel structures 59D2 may be on a boundary area BR. The plurality of third dummy channel structures 59D3 may be on a connection area EX.

Referring to FIG. 7, the semiconductor device according to the embodiment may include a substrate 21, a first lower insulating layer 23, a plurality of transistors 25, a second lower insulating layer 27, a plurality of peripheral circuit interconnections 29, a third lower insulating layer 31, a fourth lower insulating layer 33, a first buried conductive pattern 34, a plurality of dummy conductive patterns 34D, a source mold layer 35, a second buried conductive pattern 37, a support 38, a lower molding layer 39, a stack structure 40, a molding layer 49, the selection line isolation pattern 55, the plurality of cell channel structures 59, the plurality of first dummy channel structures 59D1, the second dummy channel structure 59D2, the plurality of third dummy channel structures 59D3, a first upper insulating layer 73, the plurality of word line isolation patterns 75, a plurality of bit plugs 77, a plurality of bit lines 79, a second upper insulating layer 83, a third upper insulating layer 85, the through electrode 87, and an upper interconnection 89.

Each of the plurality of first dummy channel structures 59D1 may extend in the second direction into the molding layer 49 on the peripheral area PR. Some of the plurality of first dummy channel structures 59D1 may pass through the molding layer 49, the support 38, and the source mold layer 35 and extend into the plurality of dummy conductive patterns 34D. Some others of the plurality of first dummy channel structures 59D1 may pass through the molding layer 49 and extend into the lower molding layer 39. The second dummy channel structure 59D2 may extend in the second direction into the molding layer 49 on the boundary area BR. The second dummy channel structure 59D2 may pass through the molding layer 49 and extend into the lower molding layer 39. Each of the plurality of third dummy channel structures 59D3 may extend in the second direction into the molding layer 49 and the stack structure 40 on the connection area EX. Some of the plurality of third dummy channel structures 59D3 may pass through the molding layer 49, the stack structure 40, the support 38, and the second buried conductive pattern 37 and extend into the first buried conductive pattern 34.

Upper surfaces of the plurality of first dummy channel structures 59D1, the second dummy channel structure 59D2, the plurality of third dummy channel structures 59D3, and the plurality of cell channel structures 59 may be substantially coplanar. Lower ends of the plurality of first dummy channel structures 59D1, a lower end of the second dummy channel structure 59D2, and lower ends of the plurality of third dummy channel structures 59D3 may be at a similar level to lower ends of the plurality of cell channel structures 59. A lateral width of each of the plurality of first dummy channel structures 59D1, the second dummy channel structure 59D2, and the plurality of third dummy channel structures 59D3 may be substantially equal to a lateral width of each of the plurality of cell channel structures 59.

Referring to FIG. 8, the semiconductor device according to the embodiment may include the substrate 21, the first lower insulating layer 23, the plurality of transistors 25, the second lower insulating layer 27, the plurality of peripheral circuit interconnections 29, the third lower insulating layer 31, the fourth lower insulating layer 33, the first buried conductive pattern 34, the plurality of dummy conductive patterns 34D, the source mold layer 35, the second buried conductive pattern 37, the support 38, the lower molding layer 39, a lower stack structure 140, an upper stack structure 240, a first molding layer 149, a second molding layer 249, the selection line isolation pattern 55, the plurality of cell channel structures 59, the plurality of first dummy channel structures 59D1, the second dummy channel structure 59D2, the plurality of third dummy channel structures 59D3, the first upper insulating layer 73, the plurality of word line isolation patterns 75, the plurality of bit plugs 77, the plurality of bit lines 79, the second upper insulating layer 83, the third upper insulating layer 85, the through electrode 87, and the upper interconnection 89.

The lower stack structure 140 may include a plurality of first insulating layers 141 and a plurality of first interconnection layers 145 that are alternately and repeatedly stacked. The upper stack structure 240 may include a plurality of second insulating layers 241 and a plurality of second interconnection layers 245 that are alternately and repeatedly stacked. The upper stack structure 240 may be on the lower stack structure 140. The lower stack structure 140 and the upper stack structure 240 may constitute a stack structure. The second molding layer 249 may be on the first molding layer 149. The first molding layer 149 and the second molding layer 249 may constitute a molding layer. An interface between the lower stack structure 140 and the upper stack structure 240 and an interface between the first molding layer 149 and the second molding layer 249 may be substantially coplanar.

Each of the plurality of cell channel structures 59 may pass through the upper stack structure 240, the lower stack structure 140, the support 38, and the second buried conductive pattern 37 and may extend into the first buried conductive pattern 34. Some of the plurality of first dummy channel structures 59D1 may pass through the second molding layer 249, the first molding layer 149, the support 38, and the source mold layer 35 and may extend into the plurality of dummy conductive patterns 34D. Some others of the plurality of first dummy channel structures 59D1 may pass through the second molding layer 249 and the first molding layer 149 and may extend into the lower molding layer 39. The second dummy channel structure 59D2 may pass through the second molding layer 249 and the first molding layer 149 and extend into the lower molding layer 39.

Some of the plurality of third dummy channel structures 59D3 may pass through the second molding layer 249, the upper stack structure 240, the lower stack structure 140, the support 38, and the second buried conductive pattern 37 and may extend into the first buried conductive pattern 34. Some others of the plurality of third dummy channel structures 59D3 may pass through the second molding layer 249, the first molding layer 149, the lower stack structure 140, the support 38, and the second buried conductive pattern 37 and may extend into the first buried conductive pattern 34.

Lower ends of the plurality of first dummy channel structures 59D1, a lower end of the second dummy channel structure 59D2, and lower ends of the plurality of third dummy channel structures 59D3 may be at a similar level to lower ends of the plurality of cell channel structures 59. The lower ends of the plurality of first dummy channel structures 59D1, the lower end of the second dummy channel structure 59D2, and the lower ends of the plurality of third dummy channel structures 59D3 may be relatively closer to an upper surface of the substrate 21 than an interface between the lower stack structure 140 and the upper stack structure 240. A lateral width of each of the plurality of first dummy channel structures 59D1, the second dummy channel structure 59D2, and the plurality of third dummy channel structures 59D3 may be substantially equal to a lateral width of each of the plurality of cell channel structures 59.

Referring to FIG. 9, the semiconductor device according to the embodiment may include the substrate 21, the first lower insulating layer 23, the plurality of transistors 25, the second lower insulating layer 27, the plurality of peripheral circuit interconnections 29, the third lower insulating layer 31, the fourth lower insulating layer 33, the first buried conductive pattern 34, the plurality of dummy conductive patterns 34D, the source mold layer 35, the second buried conductive pattern 37, the support 38, the lower molding layer 39, the lower stack structure 140, the upper stack structure 240, the first molding layer 149, the second molding layer 249, the selection line isolation pattern 55, the plurality of cell channel structures 59, the plurality of first dummy channel structures 59D1, the second dummy channel structure 59D2, the plurality of third dummy channel structures 59D3, the first upper insulating layer 73, the plurality of word line isolation patterns 75, the plurality of bit plugs 77, the plurality of bit lines 79, the second upper insulating layer 83, the third upper insulating layer 85, the through electrode 87, and the upper interconnection 89.

Lower ends of the plurality of first dummy channel structures 59D1 and a lower end of the second dummy channel structure 59D2 may be at a higher level than (e.g., farther from the substrate 21 in the second direction than) lower ends of the plurality of third dummy channel structures 59D3 and lower ends of the plurality of cell channel structures 59. For example, the lower ends of the plurality of first dummy channel structures 59D1 and the lower end of the second dummy channel structure 59D2 may be farther away from an upper surface of the substrate 21 than the lower ends of the plurality of third dummy channel structures 59D3 and the lower ends of the plurality of cell channel structures 59.

The lower ends of the plurality of first dummy channel structures 59D1 and the lower ends of the second dummy channel structure 59D2 may be at a level adjacent or close to an interface between the lower stack structure 140 and the upper stack structure 240. In an implementation, the lower ends of the plurality of first dummy channel structures 59D1 and the lower end of the second dummy channel structure 59D2 may be relatively closer to the upper surface of the substrate 21 than the interface between the lower stack structure 140 and the upper stack structure 240 is to the upper surface of the substrate 21. Each of the plurality of first dummy channel structures 59D1 and the second dummy channel structure 59D2 may pass through the second molding layer 249 and extend into the first molding layer 149.

Figure 10:
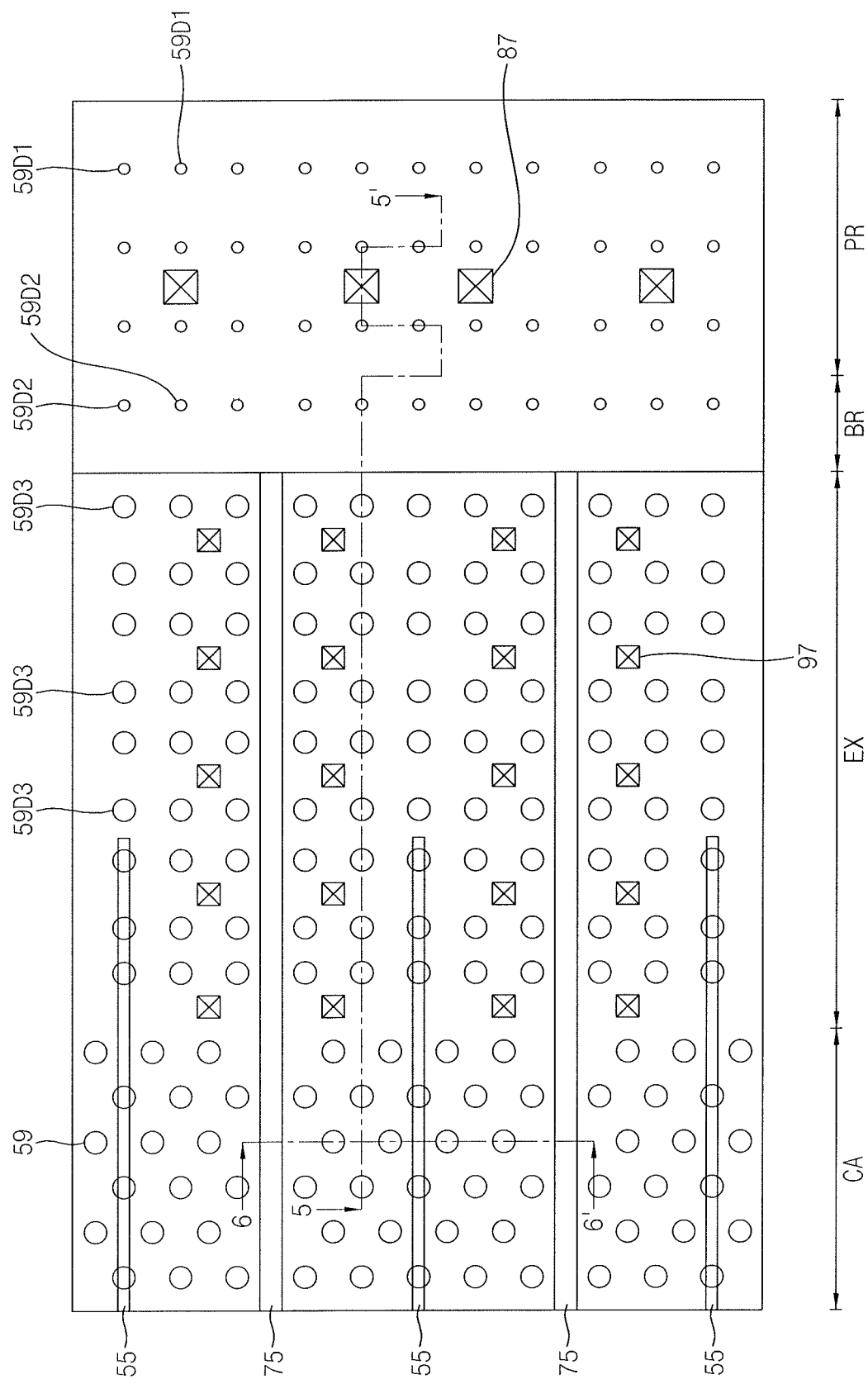
FIG. 10 illustrates a layout view of semiconductor devices according to an embodiment.
Figure 11:
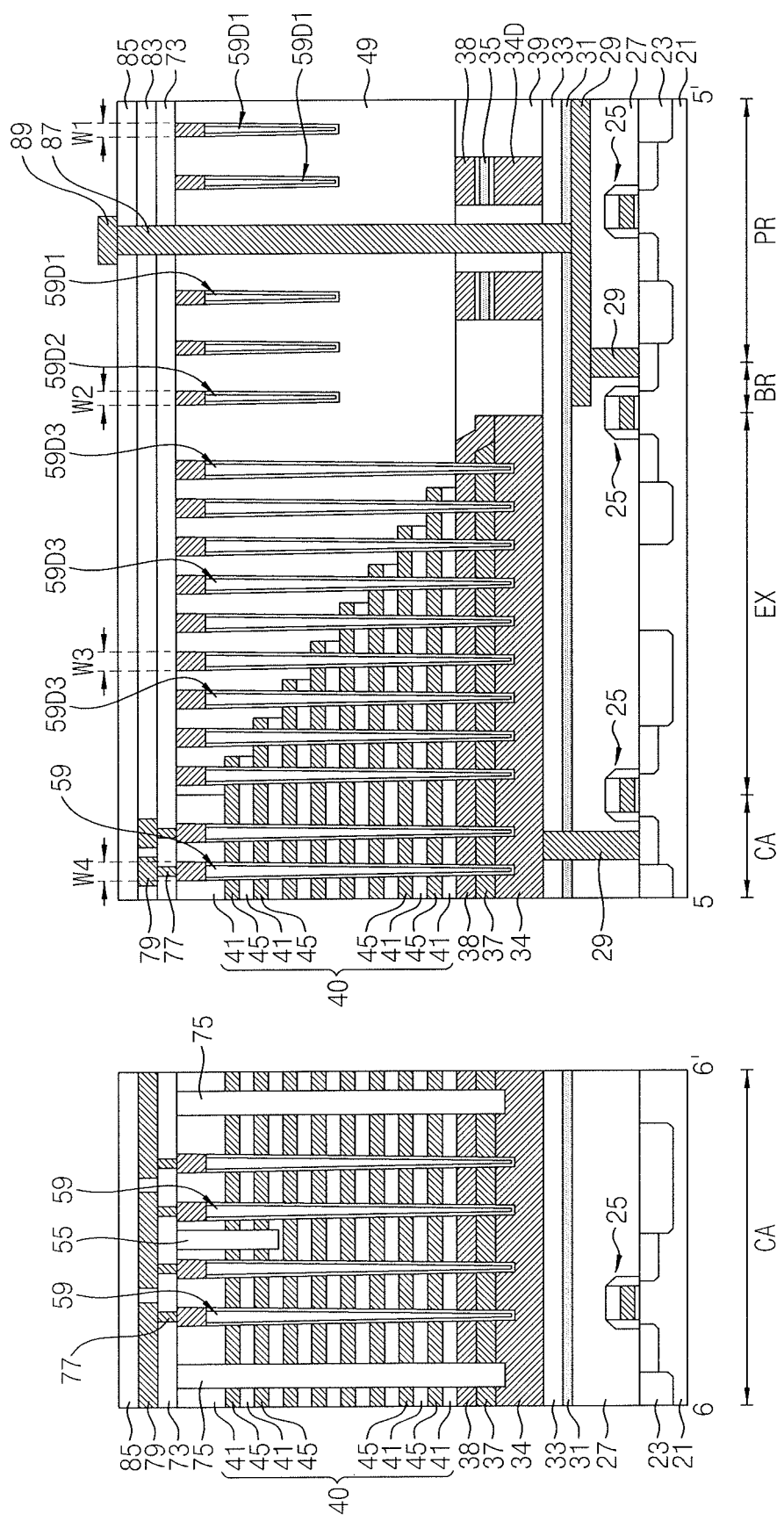
FIG. 11 illustrates a cross-sectional view of semiconductor devices according to an embodiment.

FIG. 10 illustrates a layout view of semiconductor devices according to an embodiment. FIG. 11 illustrates a cross-sectional view taken along lines 5-5' and 6-6" of FIG. 10 for describing the semiconductor devices of FIG. 10.

Referring to FIG. 10, a semiconductor device according to an embodiment may include a plurality of selection line isolation patterns 55, a plurality of cell channel structures 59, a plurality of first dummy channel structures 59D1, a plurality of second dummy channel structures 59D2, a plurality of third dummy channel structures 59D3, a plurality of word line isolation patterns 75, a through electrode 87, and a plurality of word plugs 97.

Referring to FIG. 11, the semiconductor device according to the embodiment may include a substrate 21, a first lower insulating layer 23, a plurality of transistors 25, a second lower insulating layer 27, a plurality of peripheral circuit interconnections 29, a third lower insulating layer 31, a fourth lower insulating layer 33, a first buried conductive pattern 34, a plurality of dummy conductive patterns 34D, a source mold layer 35, a second buried conductive pattern 37, a support 38, a lower molding layer 39, a stack structure 40, a molding layer 49, the selection line isolation pattern 55, the plurality of first dummy isolation patterns 55D1, the second dummy isolation pattern 55D2, the plurality of cell channel structures 59, the plurality of first dummy channel structures 59D1, the second dummy channel structure 59D2, the plurality of third dummy channel structures 59D3, a first upper insulating layer 73, the plurality of word line isolation patterns 75, a plurality of bit plugs 77, a plurality of bit lines 79, a second upper insulating layer 83, a third upper insulating layer 85, the through electrode 87, and an upper interconnection 89.

Each of the plurality of first dummy channel structures 59D1 and the second dummy channel structure 59D2 may have a relatively smaller width than each of the plurality of third dummy channel structures 59D3 and/or each of the plurality of cell channel structures 59. For example, each of the plurality of first dummy channel structures 59D1 may have a first width W1 (e.g., in the first or horizontal direction). The second dummy channel structure 59D2 may have a second width W2. Each of the third dummy channel structures 59D3 may have a third width W3. Each of the plurality of cell channel structures 59 may have a fourth width W4. Each of the first width W1 and the second width W2 may be smaller than the third width W3 or the fourth width W4. The second width W2 may be substantially equal to the first width W1. The third width W3 may be substantially equal to the fourth width W4.

Figure 12:
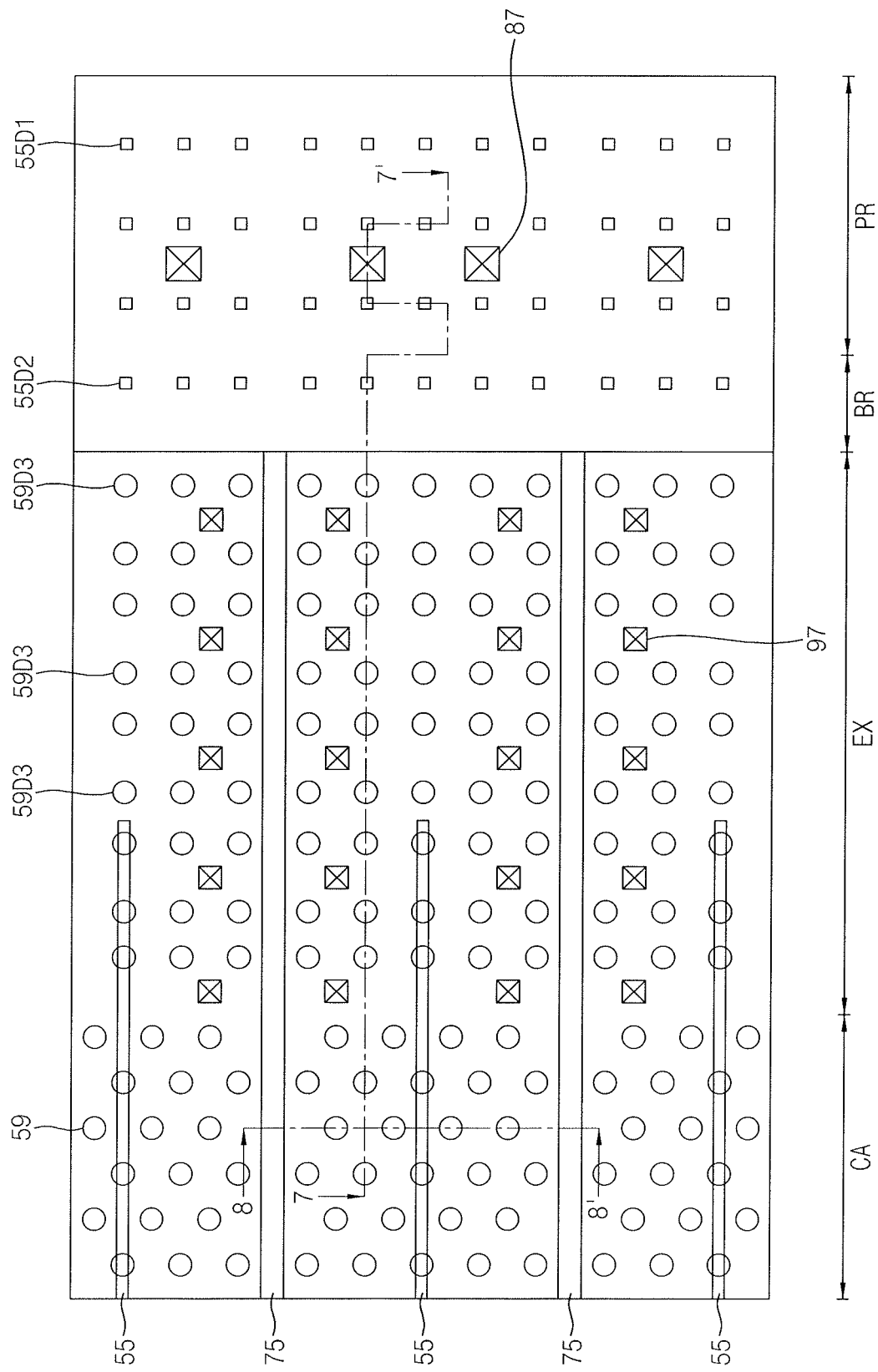
FIG. 12 illustrates a layout view of semiconductor devices according to an embodiment.
Figure 13:
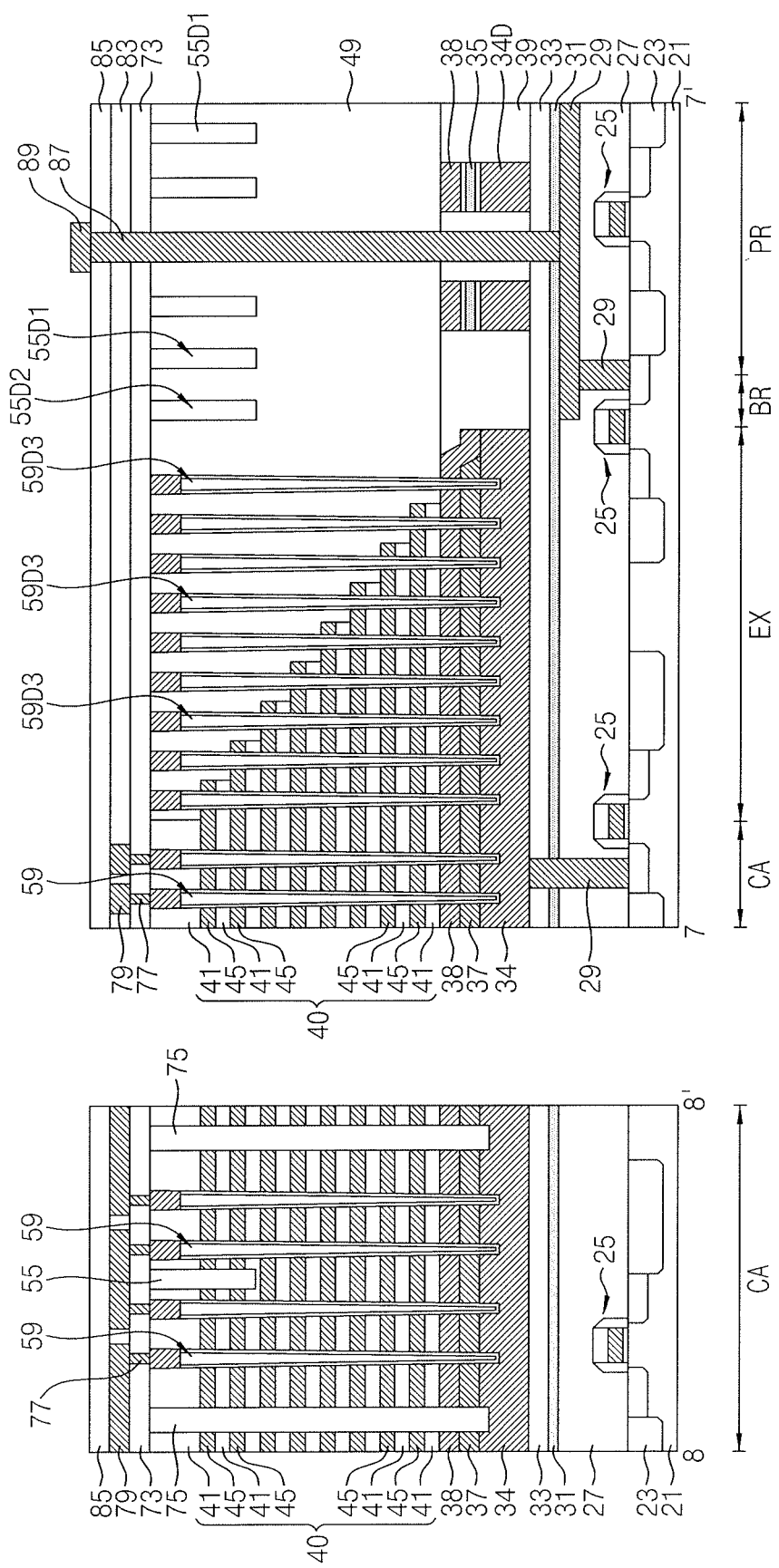
FIGS. 13 and 14 illustrate cross-sectional views of semiconductor devices according to an embodiment.
Figure 14:
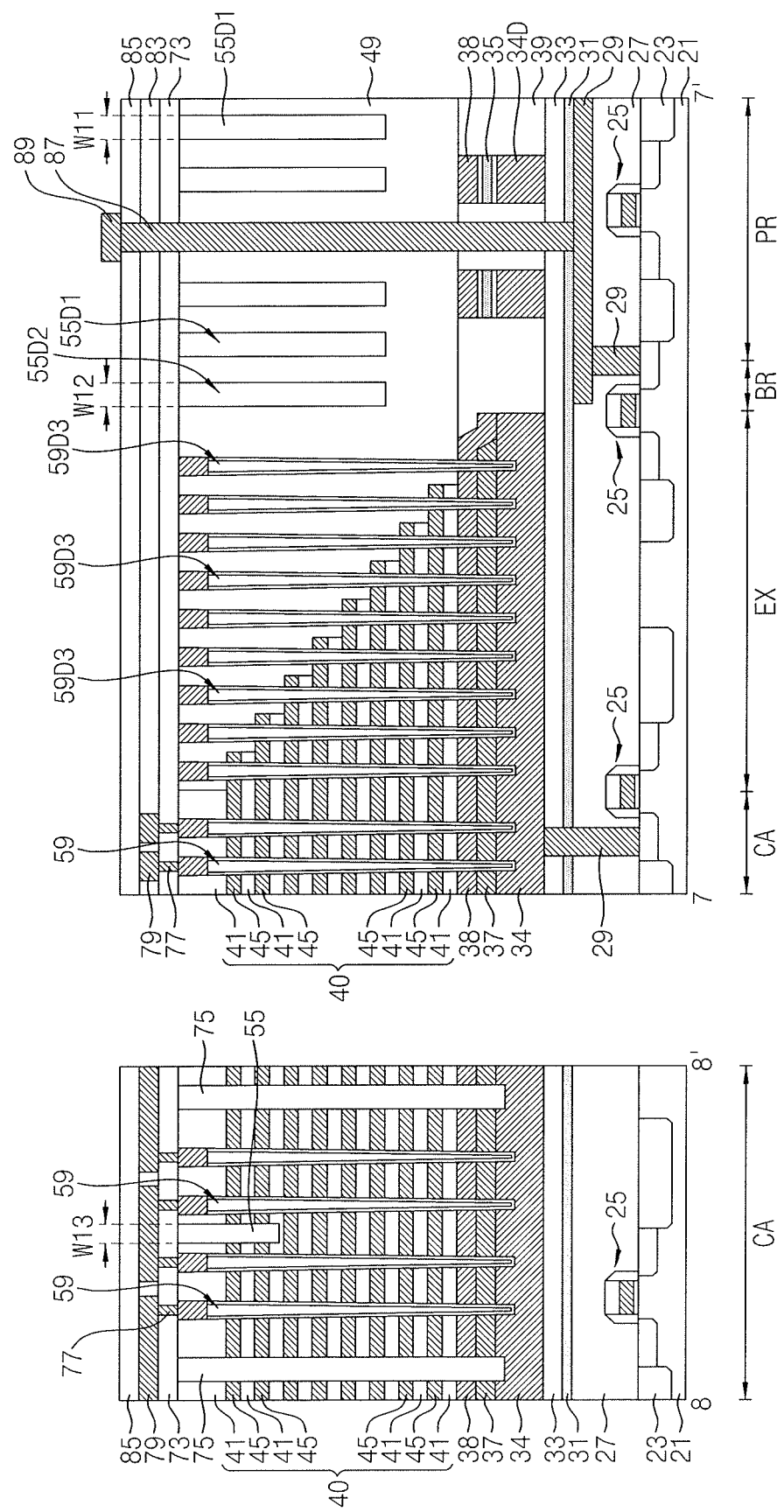

FIG. 12 illustrates a layout view of semiconductor devices according to an embodiment. FIGS. 13 and 14 illustrate cross-sectional views taken along lines 7-7' and 8-8' of FIG. 12 for describing the semiconductor devices of FIG. 12.

Referring to FIG. 12, a semiconductor device according to an embodiment may include a plurality of selection line isolation patterns 55, a plurality of first dummy isolation patterns 55D1, a plurality of second dummy isolation patterns 55D2, a plurality of cell channel structures 59, a plurality of third dummy channel structures 59D3, a plurality of word line isolation patterns 75, a through electrode 87, and a plurality of word plugs 97. The plurality of selection line isolation patterns 55 may be on a cell area CA. The plurality of first dummy isolation patterns 55D1 may be on a peripheral area PR. The plurality of second dummy isolation patterns 55D2 may be on a boundary area BR.

Referring to FIG. 13, the semiconductor device according to the embodiment may include a substrate 21, a first lower insulating layer 23, a plurality of transistors 25, a second lower insulating layer 27, a plurality of peripheral circuit interconnections 29, a third lower insulating layer 31, a fourth lower insulating layer 33, a first buried conductive pattern 34, a plurality of dummy conductive patterns 34D, a source mold layer 35, a second buried conductive pattern 37, a support 38, a lower molding layer 39, a stack structure 40, a molding layer 49, the selection line isolation pattern 55, the plurality of first dummy isolation patterns 55D1, the second dummy isolation pattern 55D2, the plurality of cell channel structures 59, the plurality of third dummy channel structures 59D3, a first upper insulating layer 73, the plurality of word line isolation patterns 75, a plurality of bit plugs 77, a plurality of bit lines 79, a second upper insulating layer 83, a third upper insulating layer 85, the through electrode 87, and an upper interconnection 89.

Each of the plurality of first dummy isolation patterns 55D1 and the second dummy isolation pattern 55D2 may extend in the second direction into the molding layer 49. Each of the plurality of first dummy isolation patterns 55D1 and the second dummy isolation pattern 55D2 may include the same material as the selection line isolation pattern 55. Upper surfaces of the selection line isolation pattern 55, the plurality of cell channel structures 59, the plurality of third dummy channel structures 59D3, the plurality of first dummy isolation patterns 55D1, and the second dummy isolation pattern 55D2 may be substantially coplanar.

As noted above, the second direction may correspond to a direction toward the substrate 21 from the upper surfaces of the selection line isolation pattern 55, the plurality of cell channel structures 59, the plurality of third dummy channel structures 59D3, the plurality of first dummy isolation patterns 55D1, and the second dummy isolation pattern 55D2 (e.g., a vertical direction in FIG. 13). Each of the plurality of first dummy isolation patterns 55D1 and the second dummy isolation pattern 55D2 may extend in the second direction and may be substantially parallel to each of the plurality of selection line isolation patterns 55. Lower ends of the plurality of first dummy isolation patterns 55D1 and a lower end of the second dummy isolation pattern 55D2 may be at substantially the same level as a lower end of the selection line isolation pattern 55. The lower ends of the plurality of first dummy isolation patterns 55D1 and the second dummy isolation pattern 55D2 may be farther away from an upper surface of the substrate 21 than lower ends of the plurality of cell channel structures 59 and lower ends of the plurality of third dummy channel structures 59D3.

Referring to FIG. 14, the semiconductor device according to the embodiment may include the substrate 21, the first lower insulating layer 23, the plurality of transistors 25, the second lower insulating layer 27, the plurality of peripheral circuit interconnections 29, the third lower insulating layer 31, the fourth lower insulating layer 33, the first buried conductive pattern 34, the plurality of dummy conductive patterns 34D, the source mold layer 35, the second buried conductive pattern 37, the support 38, the lower molding layer 39, the stack structure 40, the molding layer 49, the selection line isolation pattern 55, the plurality of first dummy isolation patterns 55D1, the second dummy isolation pattern 55D2, the plurality of cell channel structures 59, the plurality of third dummy channel structures 59D3, the first upper insulating layer 73, the plurality of word line isolation patterns 75, the plurality of bit plugs 77, the plurality of bit lines 79, the second upper insulating layer 83, the third upper insulating layer 85, the through electrode 87, and the upper interconnection 89.

Each of the plurality of first dummy isolation patterns 55D1 and the second dummy isolation pattern 55D2 may have a width greater than a width of the selection line isolation pattern 55. Each of the plurality of first dummy isolation patterns 55D1 may have a fifth width W11. The second dummy isolation pattern 55D2 may have a sixth width W12. The selection line isolation pattern 55 may have a seventh width W13. The sixth width W12 may be substantially equal to the fifth width W11. Each of the fifth width W11 and the sixth width W12 may be greater than the seventh width W13. Lower ends of the plurality of first dummy isolation patterns 55D1 and a lower end of the second dummy isolation pattern 55D2 may be at a lower level than a lower end of the selection line isolation pattern 55. The lower ends of the plurality of first dummy isolation patterns 55D1 and the second dummy isolation pattern 55D2 may be relatively closer to the upper surface of the substrate 21 than the lower end of the selection line isolation pattern 55.

Figure 15:
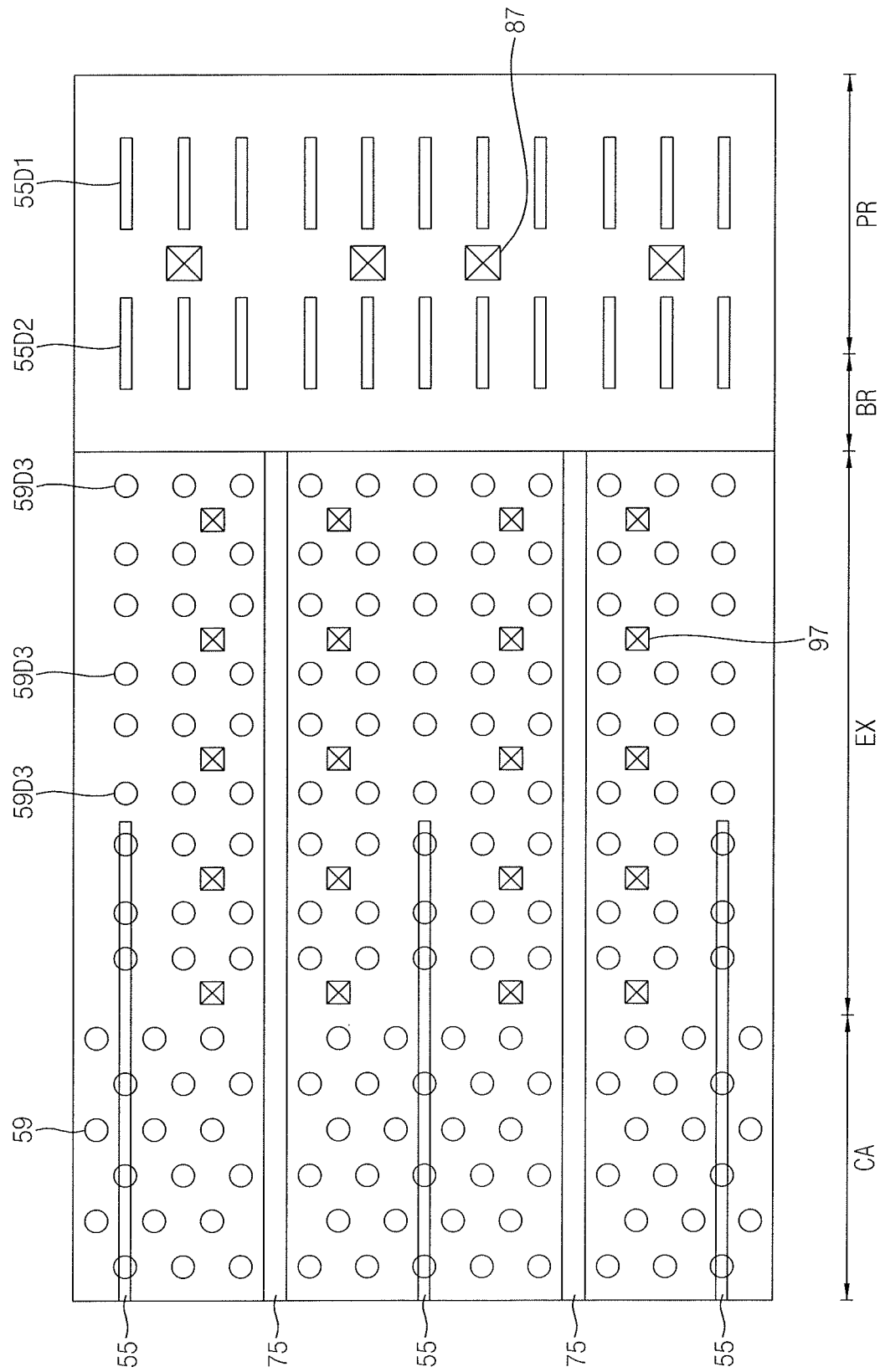
FIGS. 15 and 16 illustrate layout views of semiconductor devices according to an embodiment.
Figure 16:
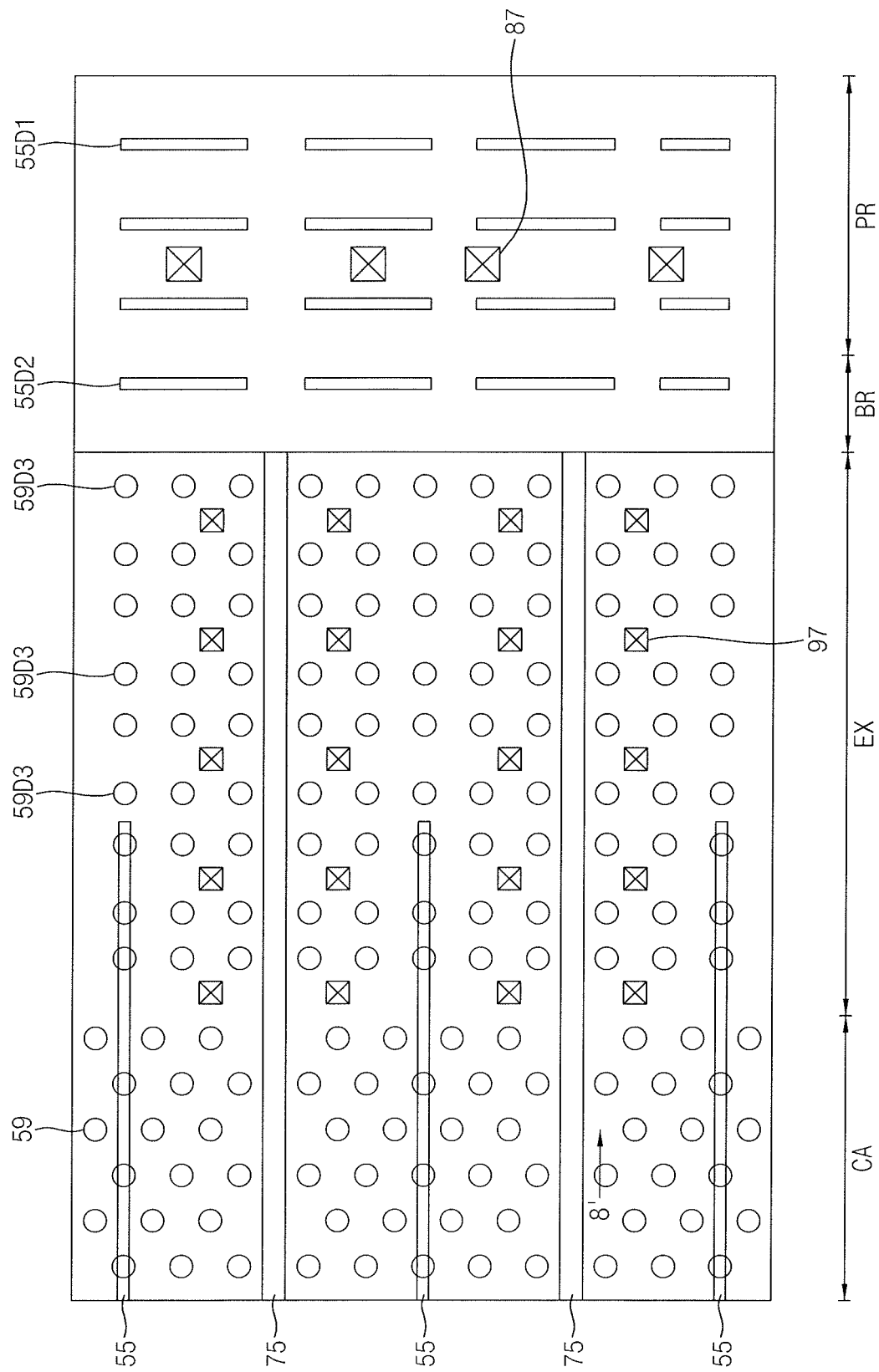

FIGS. 15 and 16 illustrate layout views of semiconductor devices according to an embodiment.

Referring to FIGS. 15 and 16, a plurality of first dummy isolation patterns 55D1 and a plurality of second dummy isolation patterns 55D2 may have various sizes and various shapes and may be arranged at various intervals. For example, each of the plurality of first dummy isolation patterns 55D1 and the plurality of second dummy isolation patterns 55D2 may have a bar shape.

FIGS. 17 to 24 illustrate cross-sectional views taken along lines 1-1' and 2-2' of FIG. 2 of stages in a method of forming semiconductor devices according to an embodiment.

Figure 17:
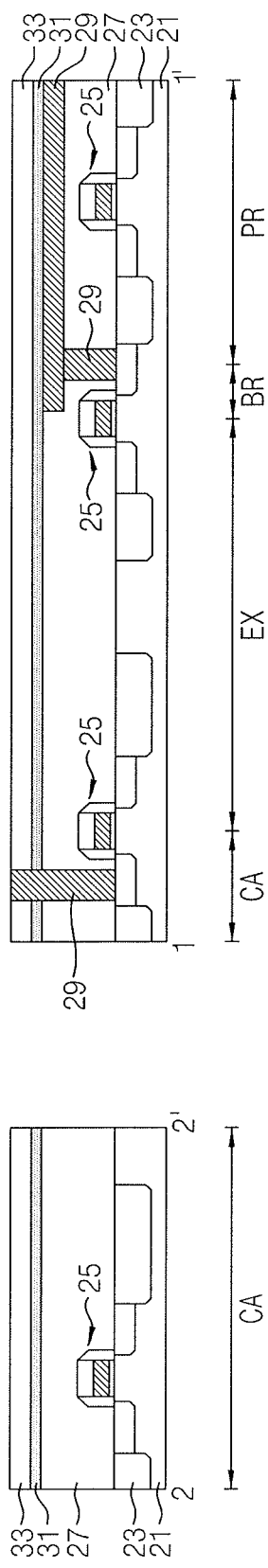

Referring to FIG. 17, a substrate 21 having a cell area CA, a connection area EX, a boundary area BR, and a peripheral area PR may be provided. A first lower insulating layer 23, a plurality of transistors 25, a second lower insulating layer 27, a plurality of peripheral circuit interconnections 29, a third lower insulating layer 31, and a fourth lower insulating layer 33 may be formed on the substrate 21.

The substrate 21 may include a semiconductor substrate such as a silicon wafer. Each of the first lower insulating layer 23, the second lower insulating layer 27, the third lower insulating layer 31, and the fourth lower insulating layer 33 may include silicon oxide, silicon nitride, silicon oxynitride, a low-k dielectric, a high-k dielectric, or a combination thereof. The first lower insulating layer 23 may correspond to a device isolation layer. The first lower insulating layer 23 may include an insulating layer formed using a shallow trench isolation (STI) method. The third lower insulating layer 31 may correspond to an etch stop layer. The third lower insulating layer 31 may include a material having an etch selectivity with respect to the fourth lower insulating layer 33.

The plurality of transistors 25 may be formed inside the substrate 21 and/or on the substrate 21 by using suitable methods. The plurality of transistors 25 may include a fin field-effect transistor (finFET), a multi-bridge channel (MBC) transistor, a nanowire transistor, a vertical transistor, a recess channel transistor, a three-dimensional (3D) transistor, a planar transistor, or a combination thereof.

The second lower insulating layer 27 may cover the first lower insulating layer 23 and the plurality of transistors 25. The third lower insulating layer 31 and the fourth lower insulating layer 33 may be sequentially formed on the second lower insulating layer 27. The plurality of peripheral circuit interconnections 29 may be formed in the second lower insulating layer 27, the third lower insulating layer 31, and the fourth lower insulating layer 33. The plurality of peripheral circuit interconnections 29 may be connected to the plurality of transistors 25. The plurality of peripheral circuit interconnections 29 may include horizontal interconnections and vertical interconnections which have various shapes. The plurality of transistors 25 and the plurality of peripheral circuit interconnections 29 may constitute a peripheral circuit.

Figure 18:
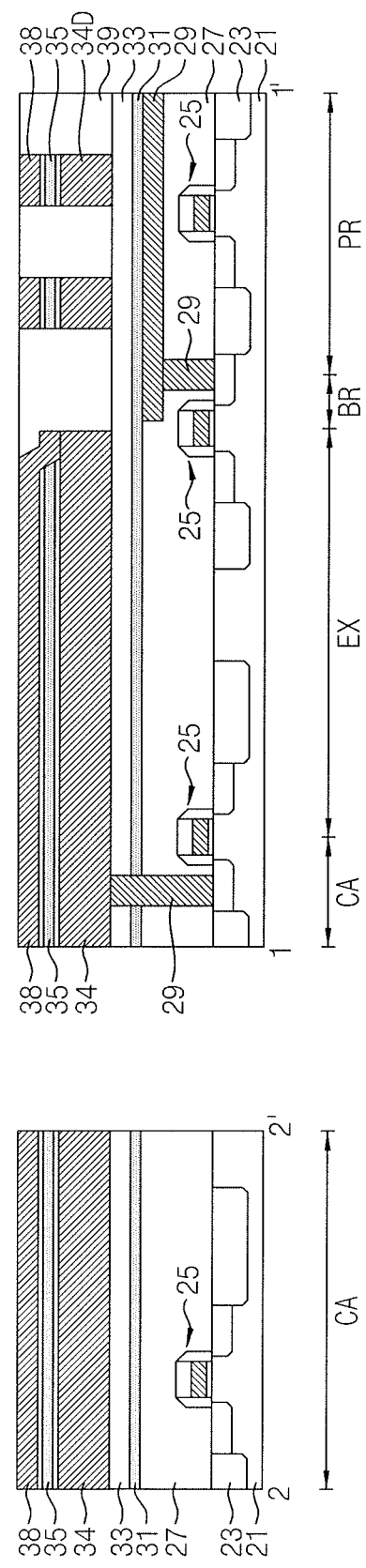

Referring to FIG. 18, a first buried conductive pattern 34, a plurality of dummy conductive patterns 34D, a source mold layer 35, a support 38, and a lower molding layer 39 may be formed on the fourth lower insulating layer 33.

The first buried conductive pattern 34 may be formed on the cell area CA. The first buried conductive pattern 34 may extend on the connection area EX. The first buried conductive pattern 34 may include a metal, a metal nitride, a metal oxide, a metal silicide, polysilicon, a conductive carbon, or a combination thereof. In an implementation, the first buried conductive pattern 34 may include polysilicon. The plurality of dummy conductive patterns 34D may be formed on the peripheral area PR. The plurality of dummy conductive patterns 34D may include the same material as the first buried conductive pattern 34.

The source mold layer 35 may be formed on the first buried conductive pattern 34 and the plurality of dummy conductive patterns 34D. In an implementation, the source mold layer 35 may include a silicon nitride layer between a pair of silicon oxide layers. The support 38 may cover the source mold layer 35. A portion of the support 38 may pass through the source mold layer 35 and may be in contact with the first buried conductive pattern 34. The support 38 may include polysilicon.

The lower molding layer 39 may be formed between the first buried conductive pattern 34 and the plurality of dummy conductive patterns 34D. The formation of the first buried conductive pattern 34, the plurality of dummy conductive patterns 34D, the source mold layer 35, the support 38, and the lower molding layer 39 may include a plurality of thin-film forming processes, a plurality of patterning processes, and a planarization process. The planarization process may include a chemical mechanical polishing (CMP) process, an etchback process, or a combination thereof. Upper surfaces of the support 38 and the lower molding layer 39 may be substantially coplanar and may be exposed.

Figure 19:
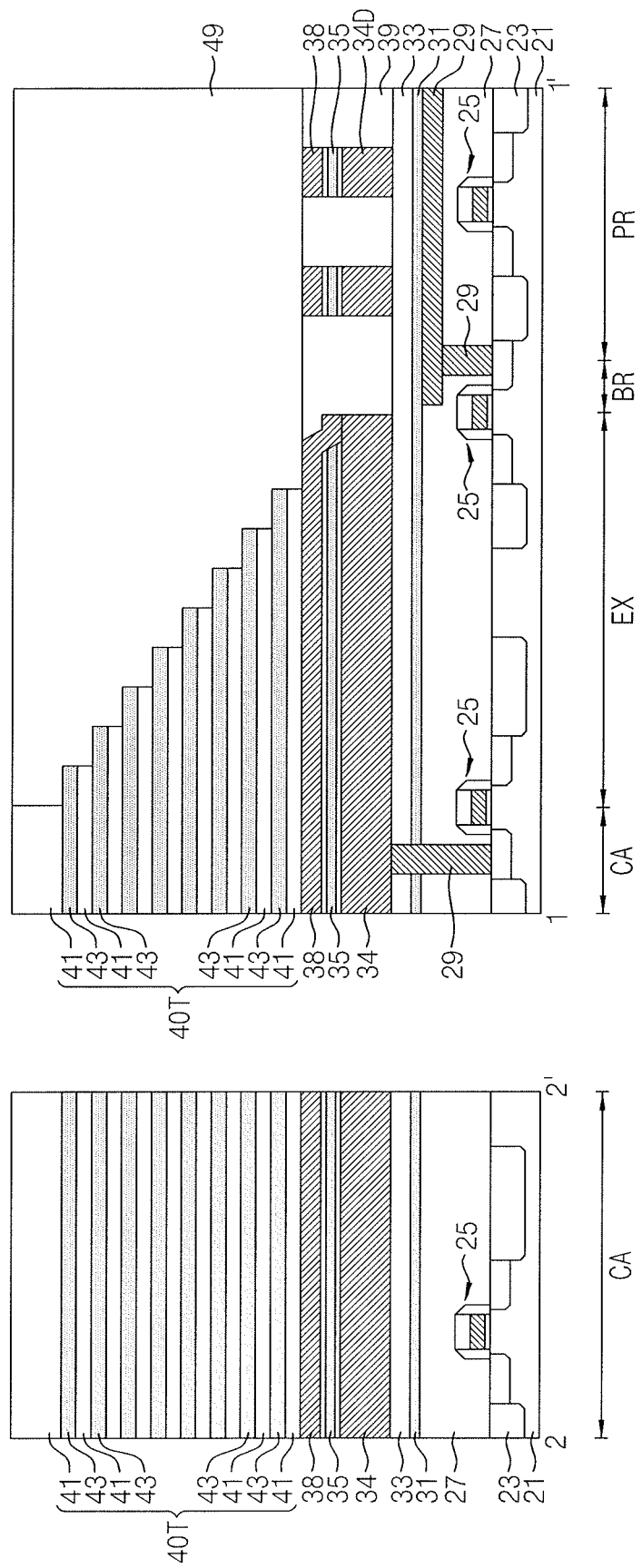

Referring to FIG. 19, a preliminary stack structure 40T and a molding layer 49 may be formed on the support 38 and the lower molding layer 39. The preliminary stack structure 40T may include a plurality of insulating layers 41 and a plurality of sacrificial layers 43, which are alternately and repeatedly stacked.

The preliminary stack structure 40T may be formed on the cell area CA. The preliminary stack structure 40T may extend onto the connection area EX. The molding layer 49 may be formed on the boundary area BR and the peripheral area PR. The molding layer 49 may extend onto the preliminary stack structure 40T on the connection area EX. The plurality of sacrificial layers 43 may include a material having an etch selectivity with respect to the plurality of insulating layers 41. For example, the plurality of insulating layers 41 may include silicon oxide, and the plurality of sacrificial layers 43 may include silicon nitride. The molding layer 49 may include an insulating layer such as silicon oxide. For example, the molding layer 49 may include a silicon oxide layer formed using tetraethylorthosilicate (TEOS).

Figure 20:
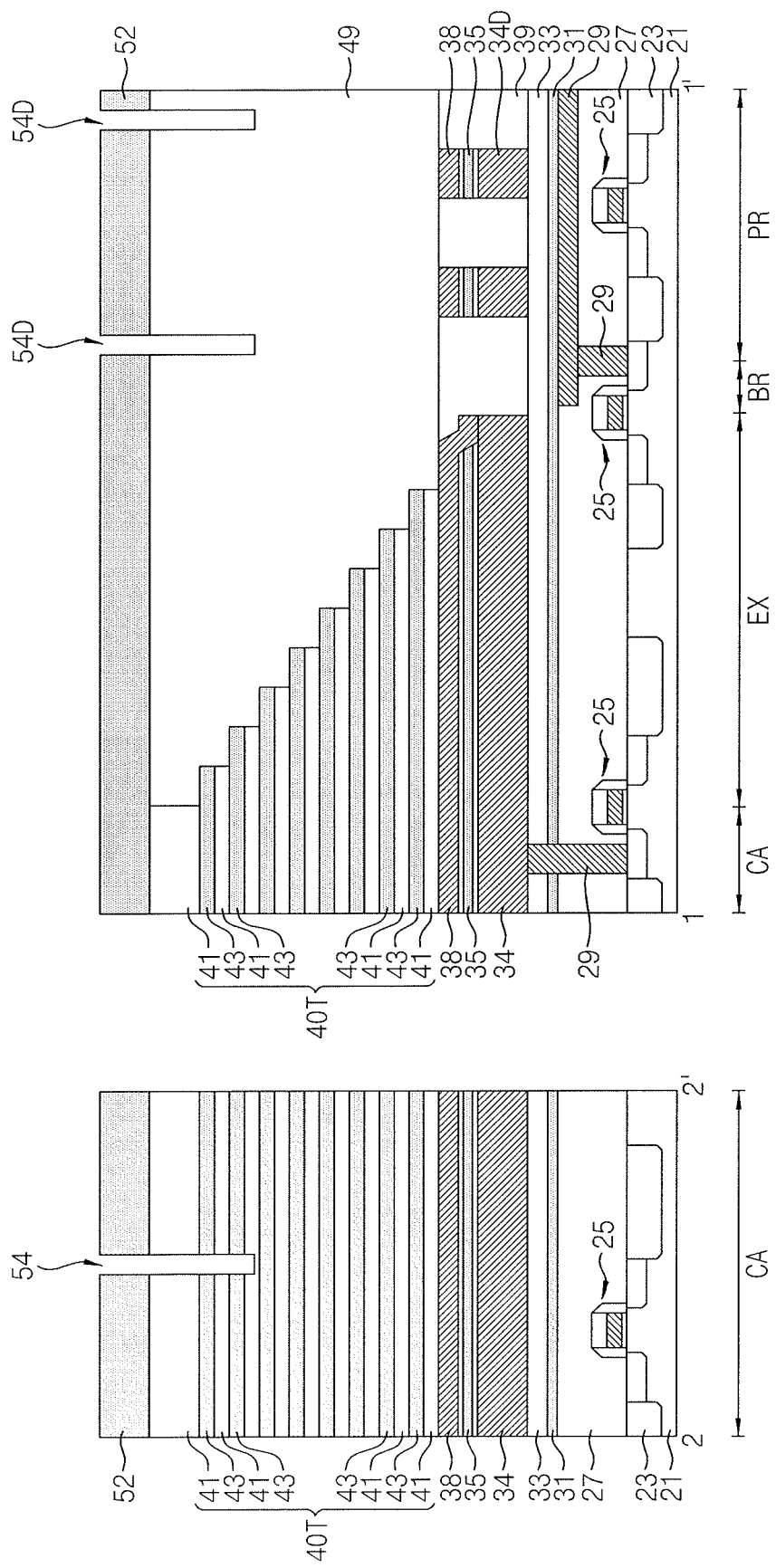

Referring to FIG. 20, a mask pattern 52 may be formed on the preliminary stack structure 40T and the molding layer 49. A selection line isolation trench 54 and a plurality of dummy selection line isolation trenches 54D may be formed using the mask pattern 52 as an etch mask. The selection line isolation trench 54 may partially pass through the preliminary stack structure 40T. The plurality of dummy selection line isolation trenches 54D may partially pass through the molding layer 49.

Referring to FIG. 21, the selection line isolation pattern 55 may be formed inside the selection line isolation trench 54, and the plurality of first dummy isolation patterns 55D1 may be formed inside the plurality of dummy selection line isolation trenches 54D. The selection line isolation pattern 55 and the plurality of first dummy isolation patterns 55D1 may include the same material and may be formed simultaneously. For example, the selection line isolation pattern 55 and the plurality of first dummy isolation patterns 55D1 may include an insulating layer including silicon oxide. The selection line isolation pattern 55 may pass through at least one of the plurality of sacrificial layers 43 which is adjacent to an upper surface of the preliminary stack structure 40T.

Figure 22:
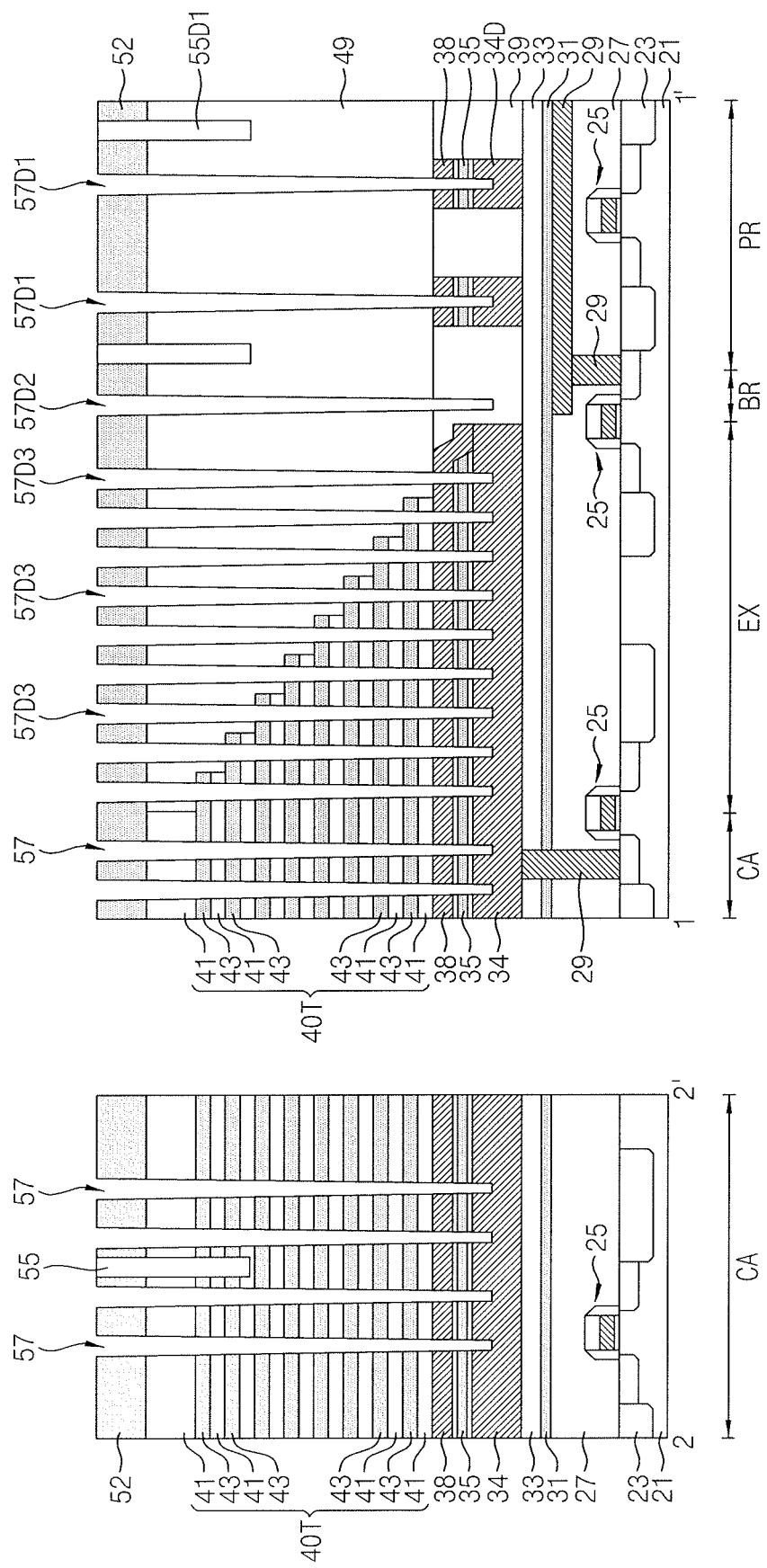

Referring to FIG. 22, a plurality of cell channel holes 57 and a plurality of dummy channel holes 57D1, 57D2, and 57D3 may be formed using a patterning process. The plurality of dummy channel holes 57D1, 57D2, and 57D3 may include a plurality of first dummy channel holes 57D1, a second dummy channel hole 57D2, and a plurality of third dummy channel holes 57D3. In an implementation, before the plurality of cell channel holes 57 and the plurality of dummy channel holes 57D1, 57D2, and 57D3 are formed, another mask pattern may be further formed on the mask pattern 52, the selection line isolation pattern 55, and the plurality of first dummy isolation patterns 55D1, and a repeated description thereof may be omitted for brevity.

Each of the plurality of cell channel holes 57 may pass through the preliminary stack structure 40T, the support 38, and the source mold layer 35 in the cell area CA and extend into the first buried conductive pattern 34. Each of the plurality of first dummy channel holes 57D1 may pass through the molding layer 49, the support 38, and the source mold layer 35 on the peripheral area PR and extend into the plurality of dummy conductive patterns 34D. The second dummy channel hole 57D2 may pass through the molding layer 49 on the boundary area BR and extend into the lower molding layer 39. Some of the plurality of third dummy channel holes 57D3 may pass through the molding layer 49, the preliminary stack structure 40T, the support 38, and the source mold layer 35 on the connection area EX and extend into the first buried conductive pattern 34.

Figure 23:
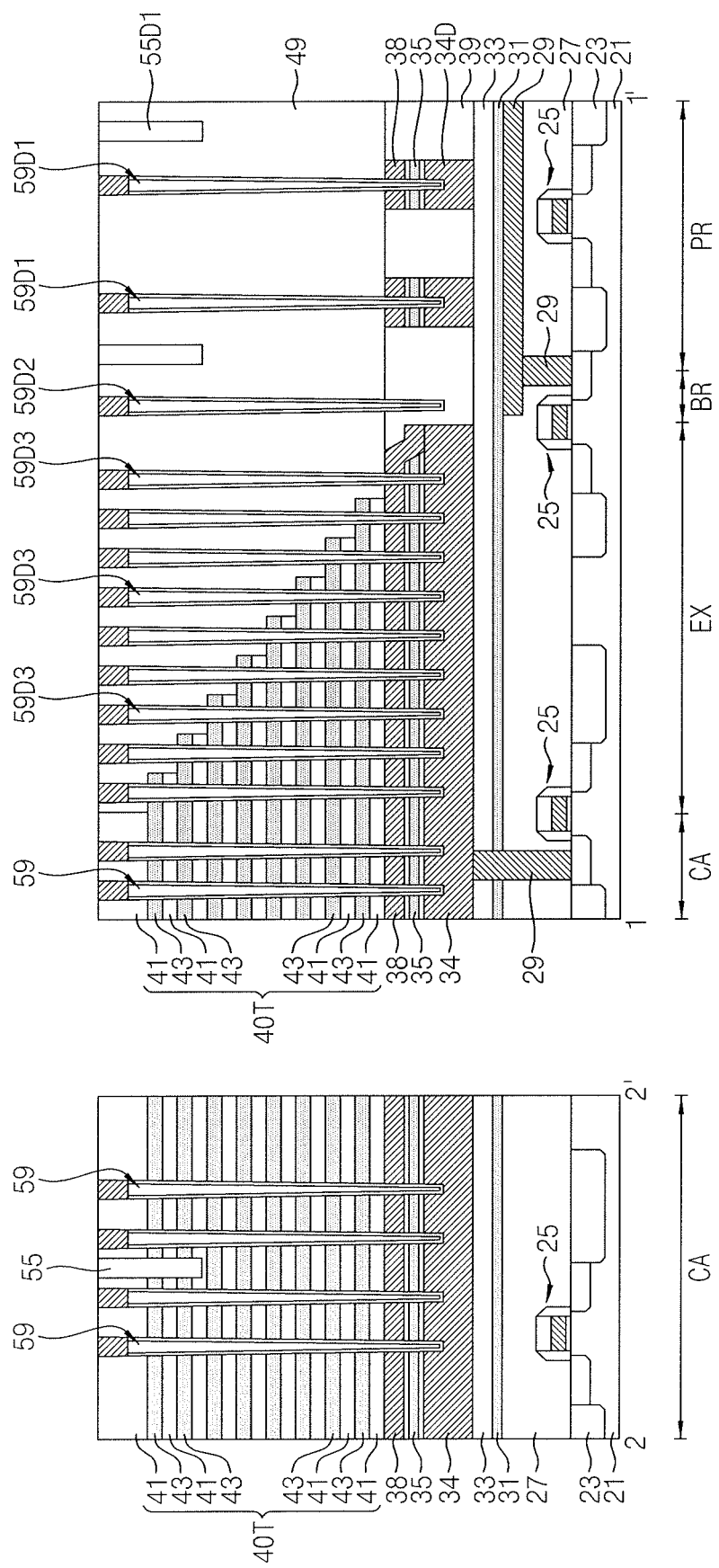

Referring to FIG. 23, the plurality of cell channel structures 59 may be formed inside the plurality of cell channel holes 57, the plurality of first dummy channel structures 59D1 may be formed inside the plurality of first dummy channel holes 57D1, the second dummy channel structure 59D2 may be formed inside the second dummy channel hole 57D2, and the plurality of third dummy channel structures 59D3 may be formed inside the plurality of third dummy channel holes 57D3. The plurality of cell channel structures 59, the plurality of first dummy channel structures 59D1, the second dummy channel structure 59D2, and the plurality of third dummy channel structures 59D3 may include the same material and may be formed simultaneously.

The mask pattern 52 may be removed to expose upper surfaces of the preliminary stack structure 40T, the molding layer 49, the selection line isolation pattern 55, the plurality of first dummy isolation patterns 55D1, the plurality of cell channel structures 59, the plurality of first dummy channel structures 59D1, the second dummy channel structure 59D2, and the plurality of third dummy channel structures 59D3. Upper surfaces of the preliminary stack structure 40T, the molding layer 49, the selection line isolation pattern 55, the plurality of first dummy isolation patterns 55D1, the plurality of cell channel structures 59, the plurality of first dummy channel structures 59D1, the second dummy channel structure 59D2, and the plurality of third dummy channel structures 59D3 may be substantially coplanar.

A process of forming the molding layer 49, the selection line isolation pattern 55, and the plurality of cell channel structures 59 may include a plurality of annealing processes. The plurality of first dummy isolation patterns 55D1, the plurality of first dummy channel structures 59D1, the second dummy channel structure 59D2, and the plurality of third dummy channel structures 59D3 may serve as paths for discharging gases generated around the molding layer 49 and the molding layer 49.

Figure 24:
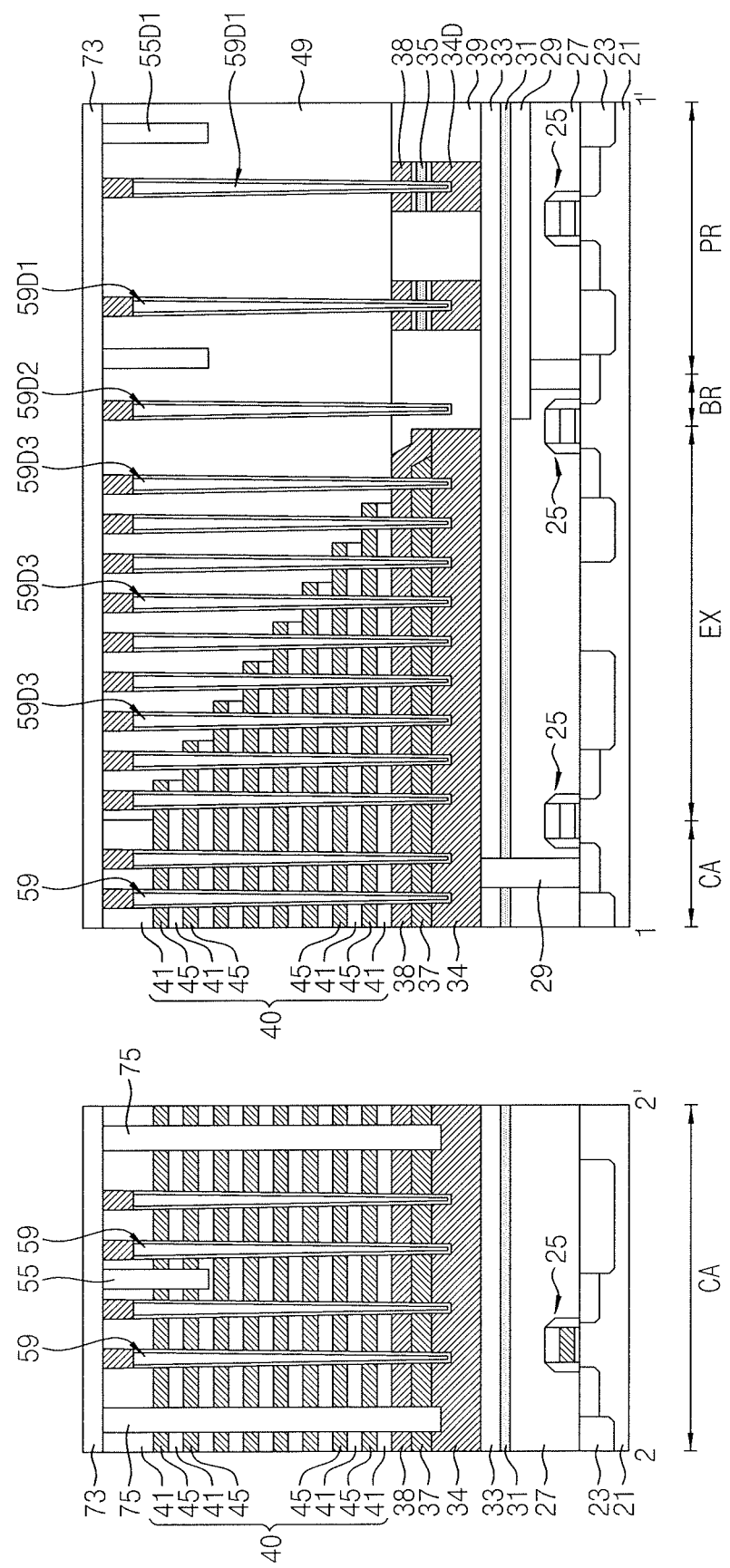

Referring to FIG. 24, the source mold layer 35 may be partially removed, and a second buried conductive pattern 37 may be formed. The second buried conductive pattern 37 may be referred to as a replacement conductive line. The second buried conductive pattern 37 may be formed on the cell area CA. The second buried conductive pattern 37 may extend onto the connection area EX. The source mold layer 35 may remain between the plurality of dummy conductive patterns 34D and the support 38 on the peripheral area PR. The second buried conductive pattern 37 may include a metal, a metal nitride, a metal oxide, a metal silicide, polysilicon, a conductive carbon, or a combination thereof.

The plurality of sacrificial layers 43 may be removed, and a plurality of interconnection layers 45 may be formed. The plurality of interconnection layers 45 may include a metal, a metal nitride, a metal oxide, a metal silicide, polysilicon, a conductive carbon, or a combination thereof. In an implementation, the plurality of interconnection layers 45 may include titanium (Ti), titanium nitride (TiN), tantalum (Ta), tantalum nitride (TaN), tungsten (W), tungsten nitride (WN), or a combination thereof. The plurality of insulating layers 41 and the plurality of interconnection layers 45, which are alternately and repeatedly stacked, may constitute a stack structure 40.

The plurality of word line isolation patterns 75, which may pass through the stack structure 40, the support 38, and the second buried conductive pattern 37 and extend into the first buried conductive pattern 34, may be formed. A first upper insulating layer 73 may be formed on the plurality of word line isolation patterns 75, the stack structure 40, the selection line isolation pattern 55, the plurality of cell channel structures 59, the molding layer 49, the plurality of first dummy isolation patterns 55D1, the plurality of first dummy channel structures 59D1, the second dummy channel structure 59D2, and the plurality of third dummy channel structures 59D3. Each of the plurality of word line isolation patterns 75 and the first upper insulating layer 73 may include silicon oxide, silicon nitride, silicon oxynitride, a low-k dielectric, a high-k dielectric, or a combination thereof.

Referring again to FIG. 1, the plurality of bit plugs 77, which may pass through the first upper insulating layer 73 and may be in contact with the plurality of cell channel structures 59, may be formed. The second upper insulating layer 83 and the plurality of bit lines 79 may be formed on the first upper insulating layer 73. The plurality of bit lines 79 may be in contact with the plurality of bit plugs 77. The third upper insulating layer 85 may be formed on the second upper insulating layer 83. The through electrode 87, which passes through the third upper insulating layer 85, the second upper insulating layer 83, the first upper insulating layer 73, the molding layer 49, the lower molding layer 39, the fourth lower insulating layer 33, and the third lower insulating layer 31 and is in contact with a selected one of the plurality of peripheral circuit interconnections 29, may be formed. The upper interconnection 89 may be formed on the third upper insulating layer 85. The upper interconnection 89 may be in contact with the through electrode 87.

Each of the plurality of bit plugs 77, the plurality of bit lines 79, the through electrode 87, and the upper interconnection 89 may include a metal, a metal nitride, a metal oxide, a metal silicide, polysilicon, a conductive carbon, or a combination thereof. Each of the second upper insulating layer 83 and the third upper insulating layer 85 may include silicon oxide, silicon nitride, silicon oxynitride, a low-k dielectric, a high-k dielectric, or a combination thereof.

By way of summation and review, thin-film forming processes and annealing processes may cause various kinds of outgassing. The various kinds of outgassing could cause product defects such as a popping defect.

According to the embodiments, a plurality of dummy isolation patterns and/or a plurality of dummy channel structures, which extend into a molding layer, may be provided. The plurality of dummy isolation patterns or the plurality of dummy channel structures may serve as paths for discharging gases generated inside the molding layer and around the molding layer. A semiconductor device may be implemented that is advantageous in increasing mass production efficiency and has excellent electrical properties.

One or more embodiments may provide a semiconductor device, which is advantageous in increasing mass production efficiency and has excellent electrical properties, and a method of forming the semiconductor device.

One or more embodiments may provide a semiconductor device that has a structure that facilitates controlled outgassing during manufacturing thereof, thereby reducing the possibility of defects that could otherwise occur due to uncontrolled outgassing.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate having a cell area, a peripheral area, and a boundary area between the cell area and the peripheral area;
   a stack structure on the cell area of the substrate, the stack structure including a plurality of insulating layers and a plurality of interconnection layers that are alternately stacked;
   a molding layer on the peripheral area and the boundary area of the substrate;
   a selection line isolation pattern extending into the stack structure;
   a cell channel structure passing through the stack structure; and
   a plurality of first dummy patterns completely spaced apart from all portions of the stack structure and extending into the molding layer on the peripheral area,
   wherein:
   upper surfaces of the plurality of first dummy patterns, an upper surface of the selection line isolation pattern, and an upper surface of the cell channel structure are substantially coplanar,
   at least one of the plurality of first dummy patterns extends substantially in parallel with the selection line isolation pattern or the cell channel structure from the upper surfaces of the plurality of first dummy patterns, the upper surface of the selection line isolation pattern, and the upper surface of the cell channel structure toward the substrate,
   the stack structure includes:
      a lower stack structure including a plurality of lower insulating layers and a plurality of lower interconnection layers that are alternately stacked; and
      an upper stack structure on the lower stack structure and including a plurality of upper insulating layers and a plurality of upper interconnection layers that are alternately stacked, and
   lower ends of the plurality of first dummy patterns are at a level adjacent to a level of an interface between the lower stack structure and the upper stack structure.

2. The semiconductor device as claimed in claim 1, wherein:
   the plurality of first dummy patterns include a first dummy channel structure,
   the first dummy channel structure extends substantially in parallel with the cell channel structure from the upper surfaces of the plurality of first dummy patterns, the upper surface of the selection line isolation pattern, and the upper surface of the cell channel structure toward the substrate, and
   each of the cell channel structure and the first dummy channel structure includes:
      a channel layer;
      a tunnel insulating layer outside of the channel layer;
      a charge storage layer outside of the tunnel insulating layer; and
      a blocking layer outside of the charge storage layer.

3. The semiconductor device as claimed in claim 2, further comprising a through electrode passing through the molding layer on the peripheral area and between the first dummy channel structure and the cell area.

4. The semiconductor device as claimed in claim 1, wherein:
the plurality of first dummy patterns include a first dummy isolation pattern, and
the first dummy isolation pattern extends substantially in parallel with the selection line isolation pattern from the upper surfaces of the plurality of first dummy patterns, the upper surface of the selection line isolation pattern, and the upper surface of the cell channel structure toward the substrate.

5. The semiconductor device as claimed in claim 1, further comprising a plurality of second dummy patterns extending into the molding layer on the boundary area, wherein:
the upper surfaces of the plurality of first dummy patterns, upper surfaces of the plurality of second dummy patterns, the upper surface of the selection line isolation pattern, and the upper surface of the cell channel structure are substantially coplanar,
at least one of the plurality of second dummy patterns includes a second dummy isolation pattern or a second dummy channel structure,
the second dummy isolation pattern extends substantially in parallel with the selection line isolation pattern from the upper surfaces of the plurality of first dummy patterns, the upper surface of the selection line isolation pattern, and the upper surface of the cell channel structure toward the substrate, and
the second dummy channel structure extends substantially in parallel with the cell channel structure from the upper surfaces of the plurality of first dummy patterns, the upper surface of the selection line isolation pattern, and the upper surface of the cell channel structure toward the substrate.

6. A semiconductor device, comprising:
a substrate having a cell area, a peripheral area, and a boundary area between the cell area and the peripheral area;
a stack structure on the cell area of the substrate and including a plurality of insulating layers and a plurality of interconnection layers that are alternately stacked;
a molding layer on the peripheral area and the boundary area of the substrate;
a cell channel structure passing through the stack structure; and
a first dummy channel structure completely spaced apart from all portions of the stack structure and extending into the molding layer on the peripheral area,
wherein:
an upper surface of the first dummy channel structure and an upper surface of the cell channel structure are substantially coplanar,
the first dummy channel structure extends substantially in parallel with the cell channel structure from the upper surface of the first dummy channel structure and the upper surface of the cell channel structure toward the substrate,
the stack structure includes:
a lower stack structure including a plurality of lower insulating layers and a plurality of lower interconnection layers that are alternately stacked; and
an upper stack structure on the lower stack structure and including a plurality of upper insulating layers and a plurality of upper interconnection layers that are alternately stacked, and
a lower end of the first dummy channel structure is at a level adjacent to an interface between the lower stack structure and the upper stack structure.

7. The semiconductor device as claimed in claim 6, wherein the lower end of the first dummy channel structure is farther away from an upper surface of the substrate than a lower end of the cell channel structure is from the substrate.

8. The semiconductor device as claimed in claim 6, wherein the first dummy channel structure has a width smaller than a width of the cell channel structure.

9. The semiconductor device as claimed in claim 6, further comprising a second dummy channel structure extending into the molding layer on the boundary area.

10. The semiconductor device as claimed in claim 9, wherein an upper surface of the second dummy channel structure, the upper surface of the first dummy channel structure, and the upper surface of the cell channel structure are substantially coplanar.

11. The semiconductor device as claimed in claim 9, wherein the second dummy channel structure extends substantially in parallel with the cell channel structure from the upper surface of the first dummy channel structure and the upper surface of the cell channel structure toward the substrate.

12. The semiconductor device as claimed in claim 6, wherein:
the substrate further includes a connection area between the cell area and the boundary area, the connection area being continuous with the cell area,
the stack structure extends onto the connection area,
the molding layer extends on the stack structure on the connection area, and
the semiconductor device further includes a third dummy channel structure passing through the molding layer and the stack structure on the connection area.

* * * * *